(12) United States Patent
In et al.

(10) Patent No.: US 11,984,083 B2
(45) Date of Patent: May 14, 2024

(54) GATE DRIVER AND DISPLAY DEVICE INCLUDING THE SAME

(71) Applicant: Samsung Display Co., Ltd., Yongin-si (KR)

(72) Inventors: Hai Jung In, Yongin-si (KR); Ji Hyun Ka, Yongin-si (KR); Tae Hoon Kwon, Yongin-si (KR); Ki Myeong Eom, Yongin-si (KR); Chae Han Hyun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 65 days.

(21) Appl. No.: 17/246,328

(22) Filed: Apr. 30, 2021

(65) Prior Publication Data

US 2021/0366402 A1 Nov. 25, 2021

(30) Foreign Application Priority Data

May 20, 2020 (KR) .......................... 10-2020-0060530

(51) Int. Cl.
*G09G 3/00* (2006.01)
*G09G 3/3266* (2016.01)
*G09G 3/3275* (2016.01)

(52) U.S. Cl.
CPC ......... *G09G 3/3266* (2013.01); *G09G 3/3275* (2013.01); *G09G 2300/0809* (2013.01);
(Continued)

(58) Field of Classification Search
CPC ............... G09G 3/3266; G09G 3/3275; G09G 2300/0809; G09G 2320/0209; G09G 2320/0233; G09G 2330/021; G09G 3/36
See application file for complete search history.

(56) References Cited

U.S. PATENT DOCUMENTS 10,311,781 B2 6/2019 Lee et al.
10,453,386 B2 10/2019 Jang
(Continued)

FOREIGN PATENT DOCUMENTS

KR 10-2017-0143052 A 12/2017
KR 10-2018-0136012 A 12/2018
(Continued)

*Primary Examiner* — Michael A Faragalla
(74) *Attorney, Agent, or Firm* — Lewis Roca Rothgerber Christie LLP

(57) ABSTRACT

A gate driver includes a stage configured to output a gate signal, the stage including an input part configured to control a voltage of a first node and a voltage of a second node based on signals supplied to a first input terminal and a second input terminal, an output part configured to supply a voltage of a first power source or a voltage of a second power source as the gate signal to an output terminal based on a voltage of a third node and a voltage of a fourth node, a first signal processing part configured to supply the voltage of the second power source to the fourth node based on the voltage of the first node, or to electrically connect the second node and the fourth node through a fifth node based on a signal supplied to a third input terminal, and a second signal processing part including a first transistor connected between the third node and a sixth node to control the voltage of the third node based on an operation of the first transistor.

19 Claims, 33 Drawing Sheets

(52) U.S. Cl.
CPC ............... *G09G 2320/0209* (2013.01); *G09G 2320/0233* (2013.01); *G09G 2330/021* (2013.01)

(56) References Cited

U.S. PATENT DOCUMENTS

| | | |
|---|---|---|
| 10,553,163 B2 | 2/2020 | Chung et al. |
| 10,891,900 B2 | 1/2021 | Kim et al. |
| 11,094,245 B2 | 8/2021 | Yang et al. |
| 2019/0035322 A1* | 1/2019 | Kim .................... G09G 3/3233 |
| 2020/0160805 A1* | 5/2020 | Hong ........................ G09G 3/20 |
| 2020/0211467 A1 | 7/2020 | Kang et al. |
| 2020/0394952 A1 | 12/2020 | Na et al. |
| 2021/0217350 A1* | 7/2021 | Yang .................... G09G 3/3674 |
| 2021/0366353 A1* | 11/2021 | Weng .................... G09G 3/2092 |

FOREIGN PATENT DOCUMENTS

| | | |
|---|---|---|
| KR | 10-2019-0115144 | 10/2019 |
| KR | 10-2020-0083759 A | 7/2020 |
| KR | 10-2020-0142161 A | 12/2020 |
| WO | WO 2020/093796 A1 | 5/2020 |

\* cited by examiner

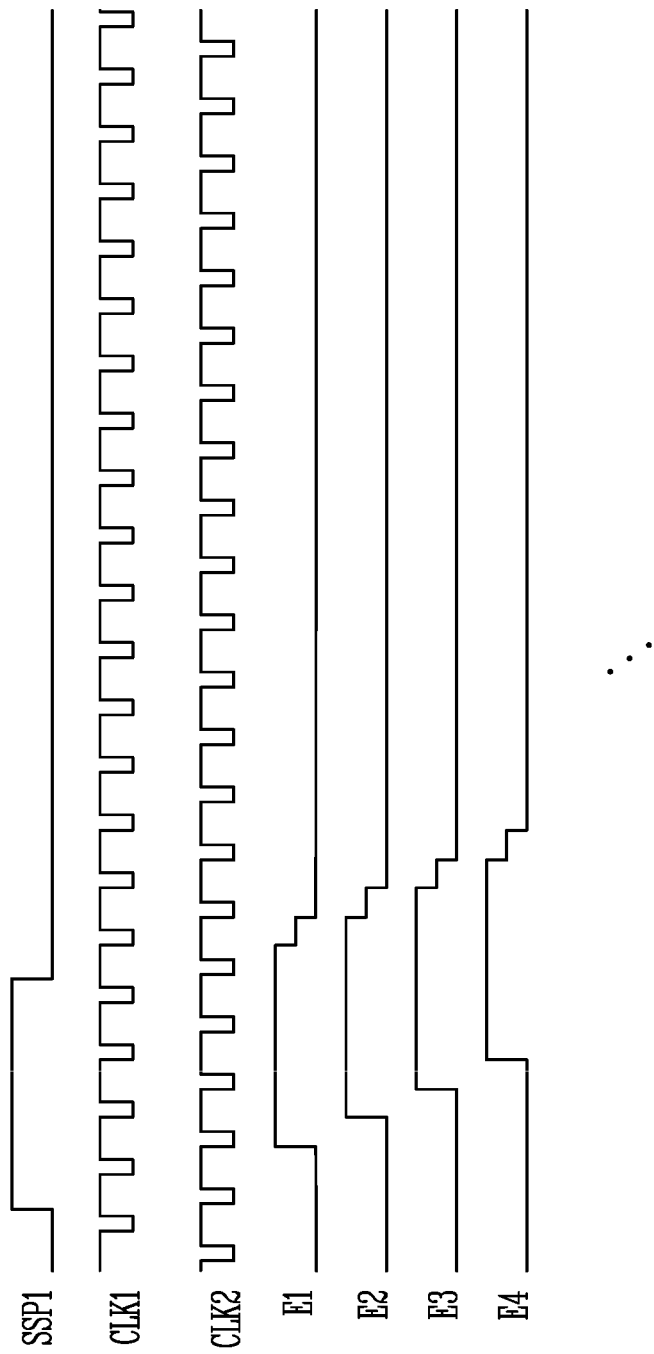

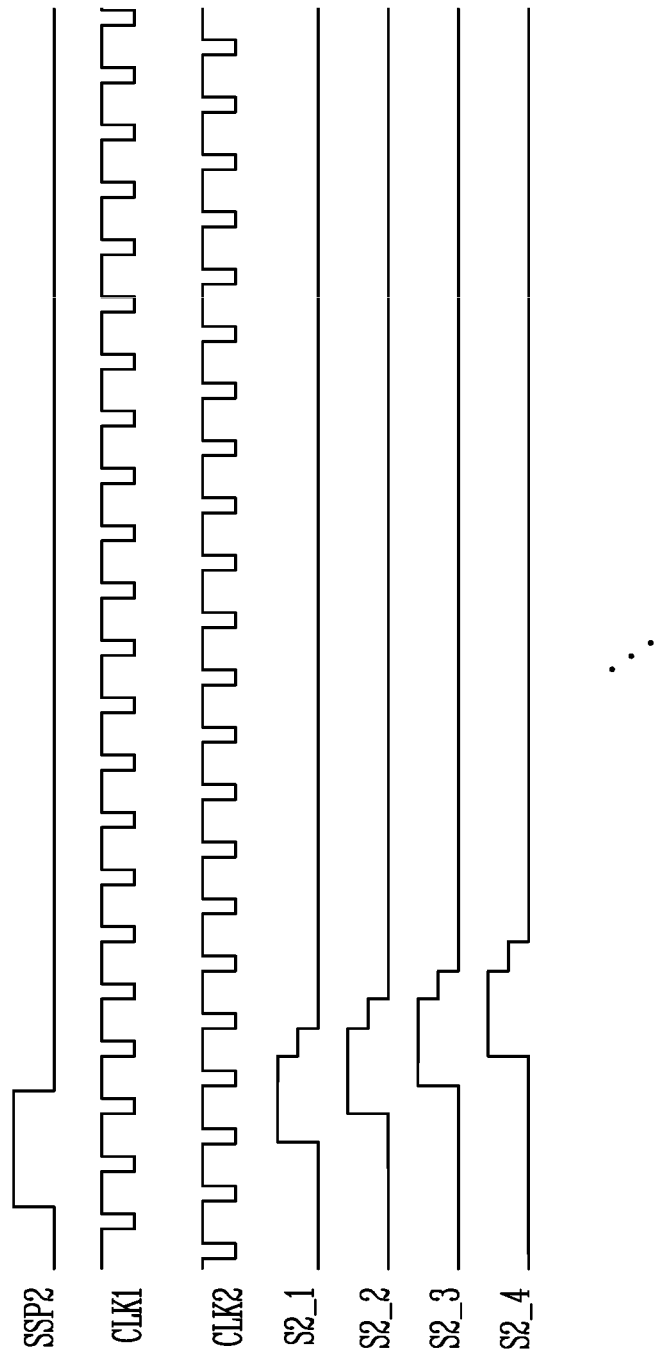

FIG. 13A
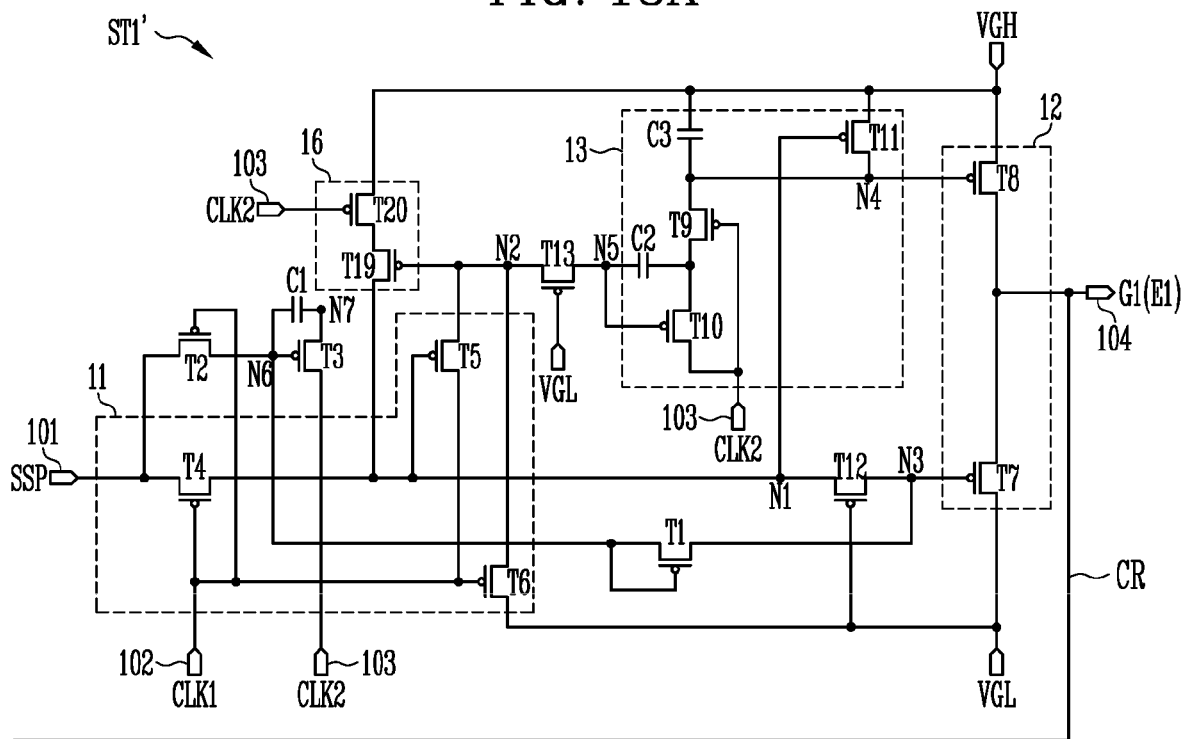
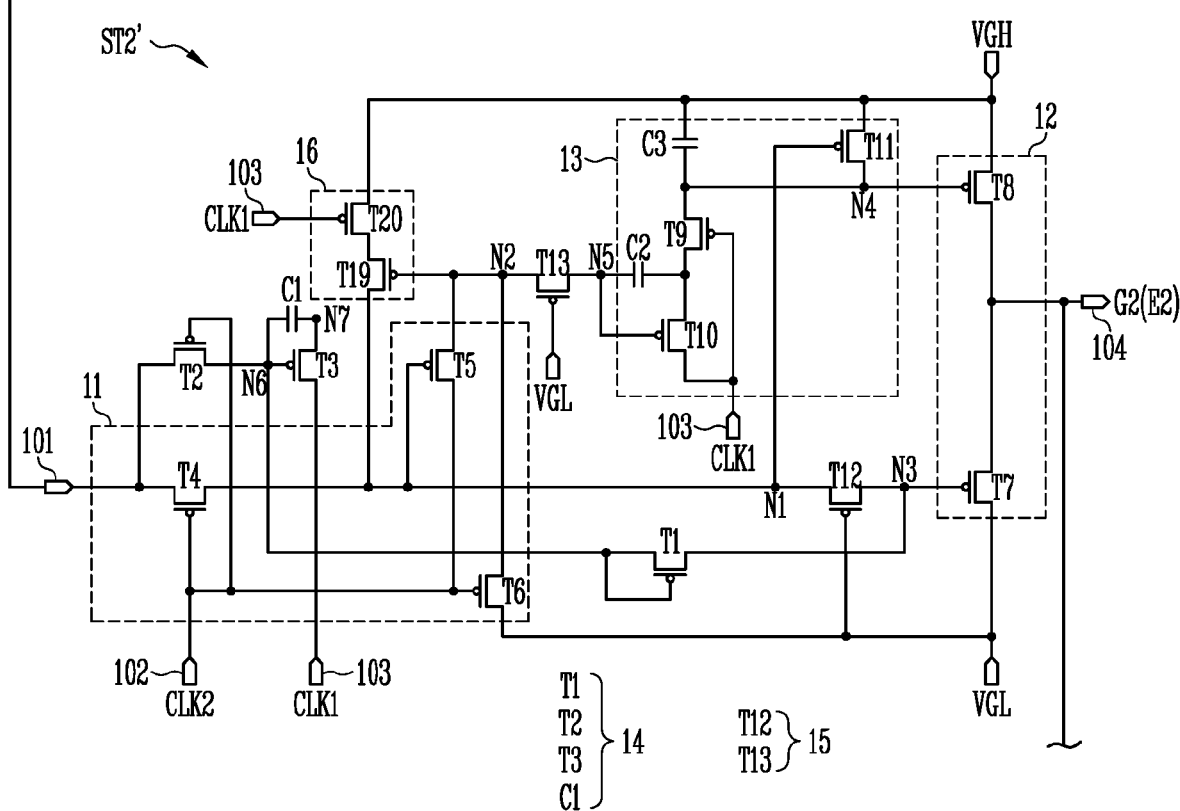

GATE DRIVER AND DISPLAY DEVICE INCLUDING THE SAME

CROSS-REFERENCE TO RELATED APPLICATION

This application claims priority to and the benefit of Korean Patent Application No. 10-2020-0060530 filed in the Korean Intellectual Property Office on May 20, 2020, the entire contents of which are incorporated herein by reference.

BACKGROUND

1. Field

Some embodiments of the present disclosure relate to a display device including a gate driver.

2. Discussion of Related Art

A display device includes a data driver for supplying a data signal to data lines, a scan driver for supplying a scan signal to scan lines, an emission driver for supplying an emission control signal to emission control lines, and pixels that are connected to the data lines, the scan lines, and the emission control lines.

The data line is on a different layer than the scan line and the emission control line, and is located to cross the scan line and the emission control line. Accordingly, parasitic capacitance components exist between the data line and the scan line, and between the data line and the emission control line.

In a recently studied display device, the data signal supplied to the data line rapidly swings according to an increase in image resolution and an increase in driving frequency, and a voltage level of the scan signal and/or the emission control signal may be unintentionally changed by coupling of the parasitic capacitance component. For example, a low level of the scan signal and/or the emission control signal is varied by the coupling due to the change in the data signal, which may cause luminance deviation such as crosstalk.

In addition, in an initial state of driving the display device, node voltages inside stages of the scan driver and the emission driver may be unstable, and thus it may be difficult for a pixel to initially emit light with a desired luminance.

SUMMARY

Some embodiments of the present disclosure may provide a gate driver and a display device including the same that may include a second signal processor controlling a voltage level of a third node used for low level output of a gate signal.

Some embodiments of the present disclosure may provide a gate driver and a display device including the same that may further include an initializing part for stably controlling light emission of pixels in an initial state of driving the display device.

Embodiments of the present disclosure are not limited to the above-described aspects, and may be variously extended without departing from the spirit and scope of some embodiments of the present disclosure.

According to some embodiments of the present disclosure, a gate driver includes a stage configured to output a gate signal, the stage including an input part configured to control a voltage of a first node and a voltage of a second node based on signals supplied to a first input terminal and a second input terminal, an output part configured to supply a voltage of a first power source or a voltage of a second power source as the gate signal to an output terminal based on a voltage of a third node and a voltage of a fourth node, a first signal processing part configured to supply the voltage of the second power source to the fourth node based on the voltage of the first node, or to electrically connect the second node and the fourth node through a fifth node based on a signal supplied to a third input terminal, and a second signal processing part including a first transistor connected between the third node and a sixth node to control the voltage of the third node based on an operation of the first transistor.

The second signal processing part may further include a second transistor connected between the first input terminal and the sixth node, and including a gate electrode connected to the second input terminal, a third transistor connected between the third input terminal and a seventh node, and including a gate electrode connected to the sixth node, and a first capacitor connected between the sixth node and the seventh node, wherein the gate electrode of the first transistor is connected to the sixth node.

The second signal processing part may further include a fourteenth transistor connected between the second transistor and the sixth node, and including a gate electrode configured to receive the voltage of the first power source.

The second signal processing part may include a fifteenth transistor connected between the second power source and the seventh node, and including a gate electrode connected to the second node.

The second signal processing part may further include a second transistor connected between the first node and the sixth node, a third transistor connected between the third input terminal and a seventh node, and including a gate electrode connected to the sixth node, and a first capacitor connected between the sixth node and the seventh node, wherein a gate electrode of the first transistor is connected to the sixth node.

The second signal processing part may further include a fifteenth transistor connected between the second power source and the seventh node, and including a gate electrode connected to the second node.

The stage may further include a stabilizing part electrically connected between the input part and the output part, and configured to limit a voltage drop amount of the first node and a voltage drop amount of the second node.

The stabilizing part may include a twelfth transistor connected between the first node and the third node, and including a gate electrode for receiving the voltage of the first power source, and a thirteenth transistor connected between the second node and the fifth node, and including a gate electrode for receiving the voltage of the first power source.

The stage may further include an initializing part configured to supply the voltage of the second power source to the first node during an initializing period.

The initializing part may include a nineteenth transistor and a twentieth transistor connected in series between the second power source and the first node, wherein the nineteenth transistor includes a gate electrode connected to the second node, and wherein the twentieth transistor includes a gate electrode connected to the third input terminal.

The initializing part may include a sixteenth transistor connected between the second power source and the first node, and including a gate electrode for receiving a reset signal.

The gate driver may be configured to substantially simultaneously output the gate signal having a high level to all of gate lines during the initializing period.

The input part may include a fourth transistor connected between the first input terminal and the first node, and including a gate electrode connected to the second input terminal, a fifth transistor connected between the second input terminal and the second node, and including a gate electrode connected to the first node, and a sixth transistor connected between the first power source and the second node, and including a gate electrode connected to the second input terminal.

The output part may include a seventh transistor connected between the first power source and the output terminal, and including a gate electrode connected to the third node, and an eighth transistor connected between the second power source and the output terminal, and including a gate electrode connected to the fourth node.

The output part may further include a seventeenth transistor connected between the first node and an eighth node, and including a gate electrode connected to the first power source, an eighteenth transistor connected between the first power source and the output terminal, and including a gate electrode connected to the eighth node, and a fourth capacitor connected between the eighth node and the output terminal.

The output part may control a voltage drop amount of the gate signal by using coupling of the fourth capacitor according to a voltage change of the output terminal.

The first signal processing part may include a second capacitor including a first terminal connected to the fifth node, a ninth transistor connected between a second terminal of the second capacitor and the fourth node, and including a gate electrode connected to the third input terminal, a tenth transistor connected between the second terminal of the second capacitor and the third input terminal, and including a gate electrode connected to the fifth node, an eleventh transistor connected between the second power source and the fourth node, and including a gate electrode connected to the first node, and a third capacitor connected between the second power source and the fourth node.

The first input terminal may receive an output signal of a previous stage or a start pulse, wherein the second input terminal receives a first clock signal, and wherein the third input terminal receives a second clock signal that is shifted from the first clock signal.

According to some embodiments of the present disclosure, a display device includes pixels, a scan driver including scan stages to supply a scan signal to the pixels through scan lines, a data driver configured to supply data signals to the pixels through data lines, and an emission driver including emission control stages to supply an emission control signal to the pixels through emission control lines, wherein at least one of the scan stages or the emission control stages includes an input part configured to control a voltage of a first node and a voltage of a second node based on an output signal of a previous scan stage supplied to a first input terminal and a first clock signal supplied to a second input terminal, an output part configured to supply a voltage of a first power source or a voltage of a second power source as the scan signal or the emission control signal to an output terminal based on a voltage of a third node and a voltage of a fourth node, a first signal processing part configured to supply the voltage of the second power source to the fourth node based on the voltage of the first node or to electrically connect the second node and the fourth node through a fifth node based on a second clock signal supplied to a third input terminal, and a second signal processing part including a first transistor that is diode-connected between the third node and a sixth node to control the voltage of the third node based on an operation of the first transistor.

The second signal processing part may further include a second transistor connected between the first input terminal and the sixth node, and including a gate electrode connected to the second input terminal, a third transistor connected between the third input terminal and a seventh node and including a gate electrode connected to the sixth node, and a first capacitor connected between the sixth node and the seventh node, wherein the gate electrode of the first transistor is connected to the sixth node.

The stage of the gate driver according to some embodiments of the present disclosure may stably maintain a voltage of the third node at a 2-low level through a charge pump operation of the second signal processor including the diode-connected type first transistor. A coupling error generated in the low level gate signal may be immediately compensated by the 2-low level voltage of the third node supplied to the gate electrode of the seventh transistor. Accordingly, a low level of a gate signal output from the gate line may be maintained relatively stable.

Therefore, in the display device including the gate driver, the luminance deviation, such as crosstalk and flicker, otherwise caused by coupling between the data line and the gate line (for example, the scan line and/or the emission control lines) may be improved.

In addition, the stage of the gate driver may include the initializing part, thus it is possible to reduce or prevent flashing in which the pixels unintentionally emits light during the initializing period or driving initialization of the display device, and to stably perform start-up initialization of the display device.

However, the present disclosure is not limited to the above-described aspects, and the embodiments thereof may be various extended without departing from the spirit and scope of the present disclosure.

BRIEF DESCRIPTION OF THE DRAWINGS

FIG. 5A illustrates a timing diagram of an example of an emission control signal output from an emission driver included in the display device of FIG. 1.

FIG. 5B illustrates a timing diagram of an example of a scan signal output from a scan driver included in the display device of FIG. 1.

FIG. 13A illustrates a circuit diagram of an example of a stage included in the gate driver of FIG. 4.

DETAILED DESCRIPTION

Figure 1:
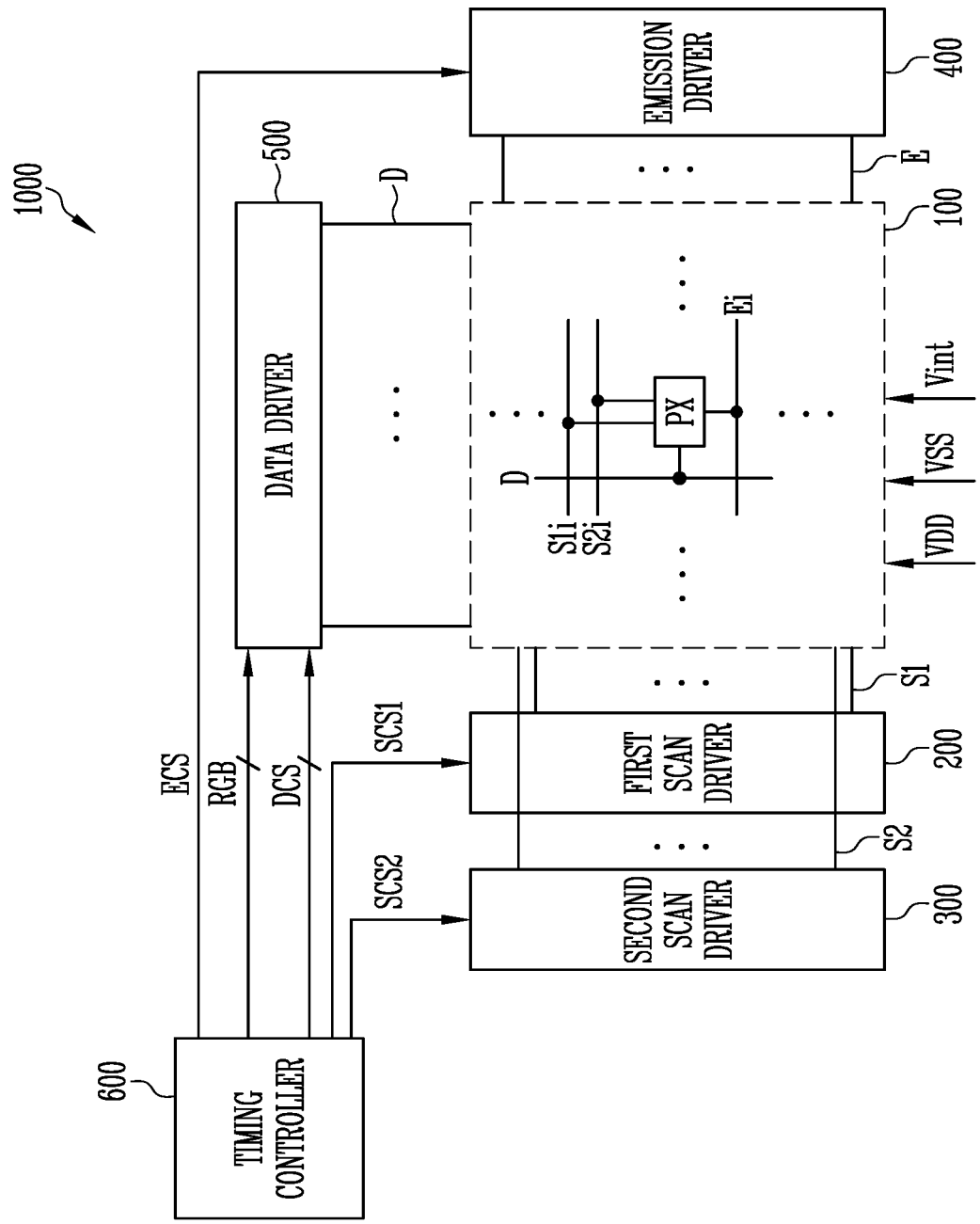
FIG. 1 illustrates a block diagram of a display device according to some embodiments of the present disclosure.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 illustrates a block diagram of a display device according to some embodiments of the present disclosure.

Referring to FIG. 1, a display device 1000 may include a display 100, a first scan driver 200 (or a first gate driver), a second scan driver 300 (or a second gate driver), an emission driver 400 (or a third gate driver), a data driver 500, and a timing controller 600.

The display device 1000 may display images at various driving frequencies (or image refresh rates and screen refresh rates) according to driving conditions. The driving frequency is a frequency at which a data signal is substantially written to a driving transistor of a pixel PX. For example, the driving frequency may be referred to as a screen refresh rate, and may represent a frequency at which a display screen is played for one second. The display device 1000 may display an image in response to various driving frequencies of 1 Hz to 120 Hz.

The display 100 displays an image. The display 100 may include the pixels PX connected to data lines D, scan lines S1 and S2, and emission control lines E. The pixels PX may receive externally supplied voltages from a first driving power source VDD, a second driving power source VSS, and an initializing power source Vint.

Additionally, the pixels PX may be connected to one or more of the first scan line S1, the second scan line S2, and the emission control line E corresponding to a pixel circuit structure.

The timing controller 600 may receive an input control signal and an input image signal from an image source, such as an external graphic device. The timing controller 600 generates image data RGB according to an operating condition of the display 100 based on the input image signal, and provides the image data RGB to the data driver 500. The timing controller 600, based on the input control signal, may generate a first driving control signal SCS1 for controlling a driving timing of the first scan driver 200, a second driving control signal SCS2 for controlling a driving timing of the second scan driver 300, a third driving control signal ECS for controlling a driving timing of the emission driver 400, and a fourth driving control signal DCS for controlling a driving timing of the data driver 500, and may provide them to the first scan driver 200, the second scan driver 300, the emission driver 400, and the data driver 500, respectively.

The first scan driver 200 may receive the first driving control signal SCS1 from the timing controller 600. The first scan driver 200 may supply a scan signal to the first scan lines S1 in response to the first driving control signal SCS1.

The second scan driver 300 may receive the second driving control signal SCS2 from the timing controller 600. The second scan driver 300 may supply a scan signal to the second scan lines S2 in response to the second driving control signal SCS2.

The emission driver 400 may receive the third driving control signal ECS from the timing controller 600. The emission driver 400 may supply an emission control signal to the emission control lines E in response to the third driving control signal ECS.

The data driver 500 may receive the fourth driving control signal DCS from the timing controller 600. The data driver 500 may convert the image data RGB into an analog data signal (e.g., a data voltage) in response to the fourth driving control signal DCS, and may supply the data signal to the data lines D.

Figure 2:
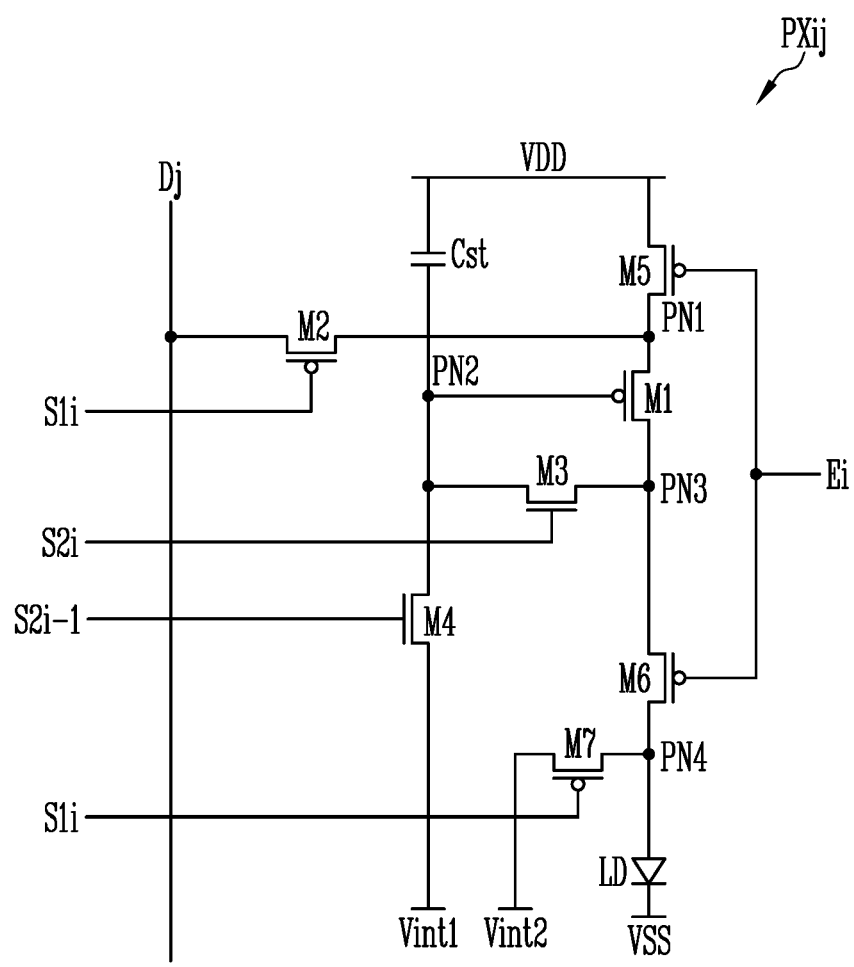
FIG. 2 illustrates a circuit diagram of an example of a pixel included in the display device of FIG. 1.

FIG. 2 illustrates a circuit diagram of an example of a pixel included in the display device of FIG. 1.

In FIG. 2, for better comprehension and ease of description, a pixel PXij located at an i-th horizontal line (or an i-th pixel row) and connected to a j-th data line Dj is illustrated (i and j are natural numbers).

Referring to FIG. 2, the pixel PXij may include a light emitting element LD, first to seventh pixel transistors M1 to M7, and a storage capacitor Cst.

A first electrode (e.g., of either anode or cathode electrodes) of the light emitting element LD is connected to a fourth pixel node PN4, and a second electrode (cathode or anode electrodes) is connected to the second driving power source VSS. The light emitting element LD generates light (e.g., light having a predetermined luminance) corresponding to an amount of current supplied from the first pixel transistor M1.

In some embodiments, the light emitting element LD may be an organic light emitting diode including an organic light emitting layer. In other embodiments, the light emitting element LD may be an inorganic light emitting element made of an inorganic material. In other embodiments, the light emitting element LD may be a light emitting element made of an inorganic material and an organic material. Alternatively, the light emitting element LD may have a form in which a plurality of inorganic light emitting elements are connected in parallel and/or in series between the second driving power source VSS and the fourth pixel node PN4.

The first pixel transistor M1 (or driving transistor) is connected between a first pixel node PN1 and a third pixel node PN3. A gate electrode of the first pixel transistor M1 is connected to a second pixel node PN2. The first pixel transistor M1 may control an amount of current flowing from the first driving power source VDD to the second driving power source VSS via the light emitting element LD in response to a voltage of the second pixel node PN2. To this end, the first driving power source VDD may be set to a higher voltage than that of the second driving power source VSS.

The second pixel transistor M2 is connected between the data line Dj and the first pixel node PN1. A gate electrode of the second pixel transistor M2 is connected to an i-th first scan line S1i. The second pixel transistor M2 is turned on when the first scan signal is supplied to the i-th first scan line S1i to electrically connect the data line Dj and the first pixel node PN1.

The third pixel transistor M3 is connected between the third pixel node PN3 and the second pixel node PN2. A gate electrode of the third pixel transistor M3 is connected to an i-th second scan line S2i. The third pixel transistor M3 is turned on when the second scan signal is supplied to the i-th second scan line S2i. Therefore, when the third pixel transistor M3 is turned on, the first pixel transistor M1 is diode-connected.

The fourth pixel transistor M4 is connected between the second pixel node PN2 and a first initializing power source Vint1. A gate electrode of the fourth pixel transistor M4 is connected to an (i−1)-th second scan line S2i−1. When the second scan signal is supplied to the (i−1)-th second scan line S2i−1, the fourth pixel transistor M4 is turned on to supply a voltage of the first initializing power source Vint1 to the second pixel node PN2. Here, the voltage of the first initializing power source Vint1 may be set to a voltage that is lower than that of a data signal supplied to the data line Dj.

Accordingly, the gate voltage of the first pixel transistor M1 is initialized to the voltage of the first initializing power source Vint1 by the turned on fourth pixel transistor M4, and the first pixel transistor M1 may have an on-bias state (that is, the first pixel transistor M1 may be initialized to an on-bias state).

The fifth pixel transistor M5 is connected between the first driving power source VDD and the first pixel node PN1. A gate electrode of the fifth pixel transistor M5 is connected to an i-th emission control line Ei. The fifth pixel transistor M5 is turned off when the emission control signal is supplied to the i-th emission control line Ei, and is turned on in other cases.

The sixth pixel transistor M6 is connected between the third pixel node PN3 and the fourth pixel node PN4/the first electrode of the light emitting element LD. A gate electrode of the sixth pixel transistor M6 is connected to the i-th emission control line Ei. The sixth pixel transistor M6 is turned off when the emission control signal is supplied to the i-th emission control line Ei, and is turned on in other cases.

The seventh pixel transistor M7 is connected between the fourth pixel node PN4/the first electrode of the light emitting element LD and a second initializing power source Vint2. A gate electrode of the seventh pixel transistor M7 is connected to the i-th first scan line S1i. When the first scan signal is supplied to the i-th first scan line S1i, the seventh pixel transistor M7 is turned on to supply a voltage of the second initializing power source Vint2 to the first electrode of the light emitting element LD.

However, the above is merely an example, and the gate electrode of the seventh pixel transistor M7 may be connected to the (i−1)-th first scan line S1i−1 or an (i+1)-th first scan line S1i+1.

Meanwhile, the first initializing power source Vint1 and the second initializing power source Vint2 may generate different voltages. That is, a voltage for initializing the second pixel node PN2 and a voltage for initializing the fourth pixel node PN4 may be set differently.

The storage capacitor Cst is connected between the first driving power source VDD and the second pixel node PN2. The storage capacitor Cst may store the voltage applied to the second pixel node PN2.

Meanwhile, the first pixel transistor M1, the second pixel transistor M2, the fifth pixel transistor M5, the sixth pixel transistor M6, and the seventh pixel transistor M7 may be formed as a poly-silicon semiconductor transistor. For example, the first pixel transistor M1, the second pixel transistor M2, the fifth pixel transistor M5, the sixth pixel transistor M6, and the seventh pixel transistor M7 may include a poly-silicon semiconductor layer formed through a low temperature poly-silicon (LTPS) process as an active layer (channel). In addition, the first pixel transistor M1, the second pixel transistor M2, the fifth pixel transistor M5, the sixth pixel transistor M6, and the seventh pixel transistor M7 may be P-type transistors. Accordingly, a gate-on voltage that turns on the first pixel transistor M1, the second pixel transistor M2, the fifth pixel transistor M5, the sixth pixel transistor M6, and the seventh pixel transistor M7 may be a low level (or a logic low level).

Because the poly-silicon semiconductor transistor has an advantage of a fast response speed, it may be applied to a switching element requiring fast switching.

The third and fourth pixel transistors M3 and M4 may be formed as an oxide semiconductor transistor. For example, the third and fourth pixel transistors M3 and M4 may be an N-type oxide semiconductor transistor, and may include an oxide semiconductor layer as an active layer. Accordingly, the gate-on voltage that turns on the third and fourth pixel transistors M3 and M4 may be a high level (or a logic high level).

The oxide semiconductor transistor may be processed at a low temperature, and has lower charge mobility than that of the poly-silicon semiconductor transistor. That is, the oxide semiconductor transistor has an excellent off-current characteristic. Accordingly, when the third pixel transistor M3 and the fourth pixel transistor M4 are formed as the oxide semiconductor transistor, a leakage current from the second pixel node PN2 and/or the third pixel node PN3 may be reduced or minimized, thereby improving display quality.

In addition, each of the second scan lines S2$i$-1 and S2$i$ may be commonly connected to two or more horizontal lines other than the i-th horizontal line. Accordingly, an initializing operation of and/or a threshold voltage compensating operation of the gate voltage of the first pixel transistors M1 of the pixels located on the plurality of horizontal lines may be simultaneously performed.

Figure 3:
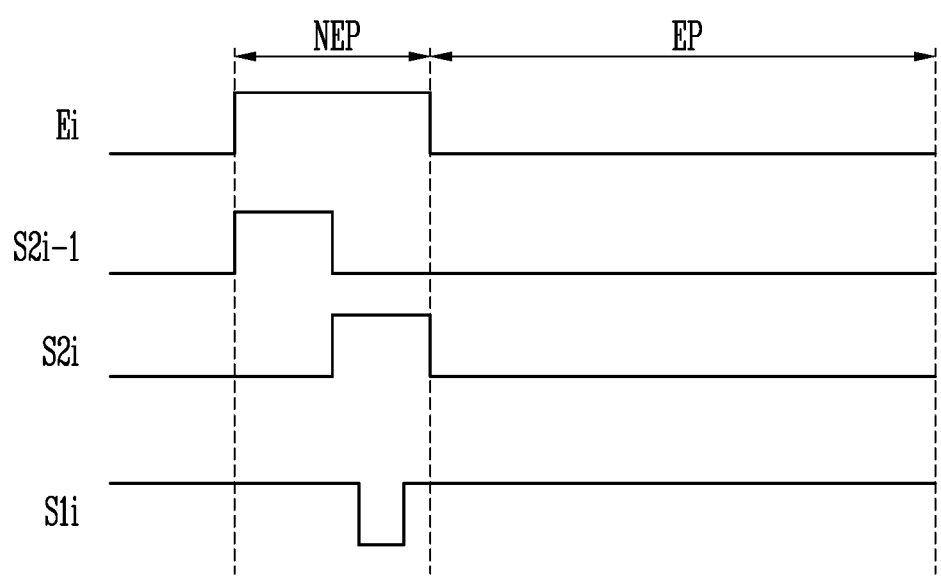
FIG. 3 illustrates a timing diagram of an example of driving the pixel of FIG. 2.

FIG. 3 illustrates a timing diagram of an example of driving the pixel of FIG. 2.

Referring to FIG. 1 to FIG. 3, the pixel PXij may receive signals for displaying an image in a non-emission period NEP, and may emit light based on the signals in an emission period EP.

A gate-on voltage of the second scan signal supplied to the i-th and (i−1)-th second scan lines S2$i$ and S2$i$−1 connected to the third and fourth pixel transistors M3 and M4, which are N-type transistors, is a high level. A gate-on voltage of the first scan signal supplied to the i-th first scan line S1$i$ connected to the second and seventh transistors M2 and M7, which are P-type transistors, is a low level. A gate-on voltage of the emission control signal supplied to the i-th emission control line Ei connected to the fifth and sixth pixel transistors M5 and M6, which are P-type transistors, is a low level.

First, the emission control signal (high level) is supplied to the i-th emission control line Ei. When the emission control signal is supplied to the i-th emission control line Ei, the fifth and sixth pixel transistors M5 and M6 are turned off. When the fifth and sixth pixel transistors M5 and M6 are turned off, the pixel PXij is set to the non-emission state.

Thereafter, a second scan signal is supplied to the (i−1)-th second scan line S2$i$−1. When the second scan signal is supplied to the (i−1)-th second scan line S2$i$−1, the fourth pixel transistor M4 is turned on. When the fourth pixel transistor M4 is turned on, the voltage of the first initializing power source Vint1 is supplied to the second pixel node PN2.

Thereafter, the first and second scan signals are respectively supplied to the i-th first scan line S1$i$ and the i-th second scan line S2$i$. When the second scan signal is supplied to the i-th second scan line S2$i$, the third pixel transistor M3 is turned on. When the third pixel transistor M3 is turned on, the first pixel transistor M1 is diode-connected, and a threshold voltage of the first pixel transistor M1 may be compensated.

When the first scan signal is supplied to the i-th first scan line S1$i$, the second pixel transistor M2 is turned on. When the second pixel transistor M2 is turned on, the data signal from the data line Dj is supplied to the first pixel node PN1. In this case, because the second pixel node PN2 is initialized with the voltage of the first initializing power source Vint1 that is lower than the data signal (for example, initialized to the on-bias state), the first pixel transistor M1 is turned on.

When the first pixel transistor M1 is turned on, the data signal supplied to the first pixel node PN1 is supplied to the second pixel node PN2 via the diode-connected first pixel transistor M1. Then, a data signal, and a voltage corresponding to the threshold voltage of the first pixel transistor M1 are applied to the second pixel node PN2. In this case, the storage capacitor Cst stores the voltage of the second pixel node PN2.

In addition, when the first scan signal is supplied to the i-th first scan line S1$i$, the seventh pixel transistor M7 is turned on. When the seventh pixel transistor M7 is turned on, the voltage of the second initializing power source Vint2 is supplied to the fourth pixel node PN4/the first electrode of the light emitting element LD. Accordingly, a residual voltage remaining in a parasitic capacitor of the light emitting element LD may be discharged.

Thereafter, the supply of the emission control signal to the i-th emission control line Ei is stopped. When the supply of the emission control signal to the i-th emission control line Ei is stopped, the fifth and sixth pixel transistors M5 and M6 are turned on. In this case, the first pixel transistor M1 controls a driving current flowing to the light emitting element LD in response to the voltage of the second pixel node PN2. Then, the light emitting element LD generates light having a luminance corresponding to an amount of the current.

in FIG. 3, although a width of the second scan signal is larger than that of the first scan signal, the widths of the scan signals are not limited thereto.

Meanwhile, a parasitic capacitance component exists between the j-th data line Dj and the i-th first scan line S1$i$, between the j-th data line Dj and the i-th second scan line S2$i$, and between the j-th data line Dj and the i-th emission control line Ei. In this case, the data signal supplied to the data line rapidly swings, and thus coupling of the parasitic capacitance component may occur.

For example, the low level of the emission control signal and the low level of the second scan signal may be varied to an unintended waveform by the coupling.

The second scan driver 300 and/or the emission driver 400 according to some embodiments of the present disclosure may include a configuration for compensating for a low level coupling error of an output signal to stably maintain the low level (e.g., as stably as possible).

Figure 4:
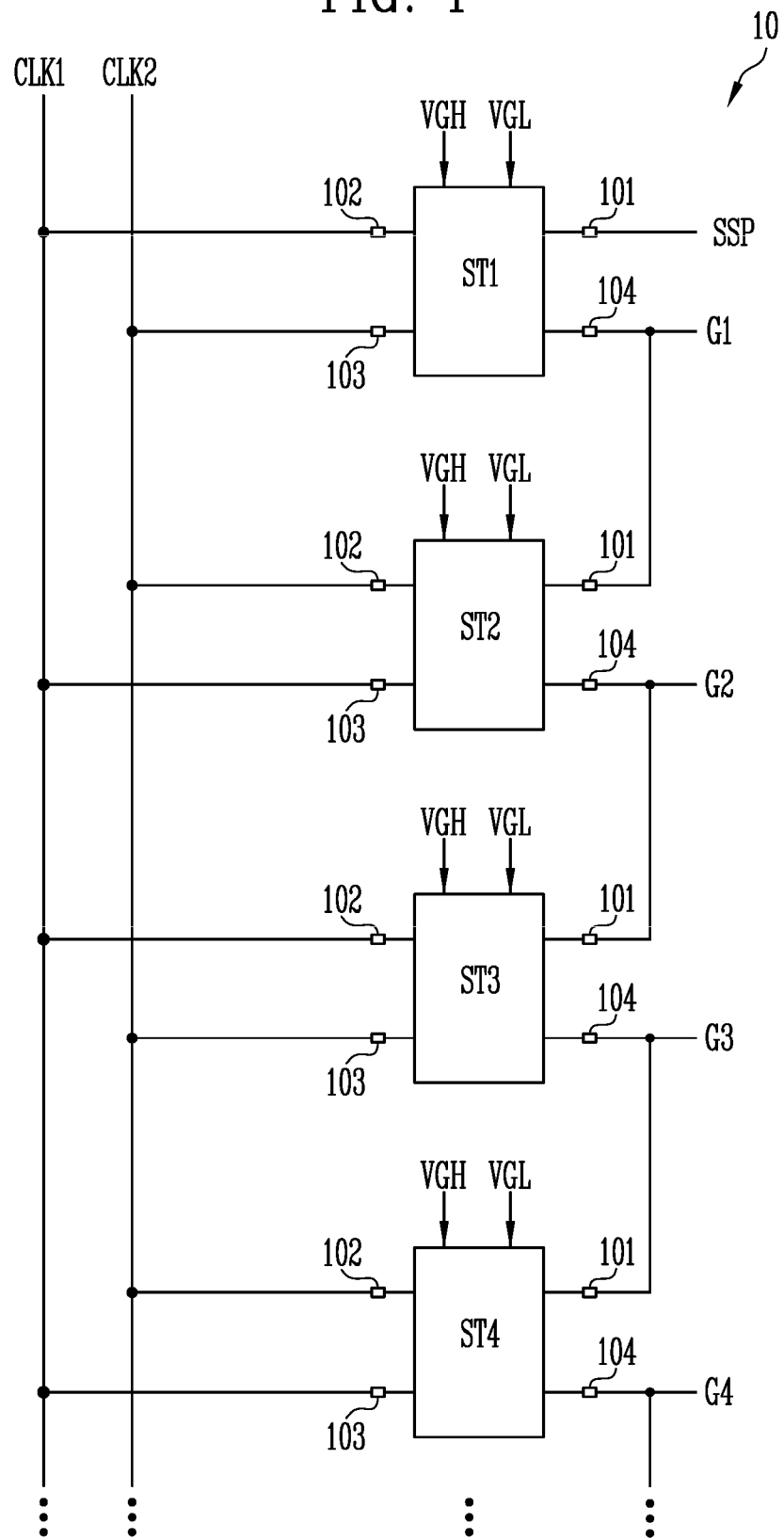
FIG. 4 illustrates a block diagram of a gate driver according to some embodiments of the present disclosure.

FIG. 4 illustrates a block diagram of a gate driver according to some embodiments of the present disclosure.

In FIG. 4, for convenience of description, four stages and gate signals output from them are illustrated.

Referring to FIG. 1 and FIG. 4, the gate driver 10 may include a plurality of stages ST1 to ST4. For example, the stages ST1 to ST4 may be connected to each of gate lines G1 to G4, and may output a gate signal corresponding to clock signals CLK1 and CLK2. The stages ST1 to ST4 may be implemented with substantially the same circuit.

In some embodiments, a gate driver 10 may configure the emission driver 400 and/or the second scan driver 300 described with reference to FIG. 1. For example, the gate lines G1 to G4 may be understood as emission control lines (for example, E1 to E4 in FIG. 5A) or second scan lines (for example, S2_1 to S2_4 in FIG. 5B).

In some embodiments, the first to fourth stages ST1 to ST4 may be respectively connected to at least one gate line G1 to G4. For example, the first stage ST1 may be connected to the first gate line G1 to supply a gate signal to the first gate line G1. However, this is merely an example, and the connection relationship between the gate lines G1 to G4 and the horizontal lines may be variously set according to the pixel structure and the driving method of the display device 1000. For example, the first gate line G1 connected to the first stage ST1 may be commonly connected to a plurality of horizontal lines (or pixel rows).

Each of the stages ST1 to ST4 may be provided with a first input terminal 101, a second input terminal 102, a third input terminal 103, and an output terminal 104.

The first input terminal 101 may receive an output signal of a previous stage (for example, an emission control signal or a second scan signal) or a start pulse SSP (for example, an emission control start pulse or a second scan start pulse). For example, the first input terminal 101 of the first stage ST1 may receive the start pulse SSP, and the first input terminal 101 of the second stage ST2 may receive a gate signal output from the first stage ST1.

In some embodiments, the second input terminal 102 of a k-th stage (k is a natural number) may receive the first clock signal CLK1, and the third input terminal 103 thereof may receive the second clock signal CLK2. In contrast, the second input terminal 102 of a (k+1)-th stage may receive the second clock signal CLK2, and the third input terminal 103 thereof may receive the first clock signal CLK1.

The first clock signal CLK1 and the second clock signal CLK2 have the same period, and their phases do not overlap each other. For example, the second clock signal CLK2 may be set as a signal shifted by about half a period from the first clock signal CLK1.

Additionally, the stages ST1 to ST4 are supplied with a voltage of a first power source VGL and a voltage of a second power source VGH. The voltage of the first power source VGL and the voltage of the second power source VGH may have a DC voltage level. The voltage of the second power source VGH may be set larger than the voltage of the first power source VGL.

The voltage of the first power source VGL may be set to a gate-off level, and the voltage of the second power source VGH may be set to a gate-on level. For example, when the pixel PX is configured of N-channel metal oxide semiconductor (NMOS) transistors, the voltage (that is, gate-off level) of the first power source VGL corresponds to a low level, and the voltage (that is, the gate-on level) of the second power source VGH may correspond to a high level. However, this is merely an example, and the first power source VGL and the second power source VGH are not limited thereto. For example, the voltage of the first power source VGL and the voltage of the second power source VGH may be set according to the type of transistor, the use environment of the display device, and the like.

FIG. 5A illustrates a timing diagram of an example of an emission control signal output from an emission driver included in the display device of FIG. 1.

Referring to FIG. 1, FIG. 4, and FIG. 5A, the gate driver 10 may be the emission driver 400. The first to fourth stages ST1 to ST4 may sequentially output emission control signals.

In some embodiments, within one frame period, the emission control start pulse SSP1 may overlap a plurality of gate-on periods and a plurality of gate-off periods of the first and second clock signals CLK1 and CLK2. The first stage ST1 may output the emission control signal to the first emission control line E1 based on the emission control start pulse SSP1 and the first and second clock signals CLK1 and CLK2.

The second stage ST2 may output the emission control signal in which the emission control signal output to the first emission control line E1 is shifted by a horizontal period (e.g., a predetermined horizontal period) to the second emission control line E2. Similarly, the third and fourth stages ST3 and ST4 may sequentially output the emission control signal at intervals (e.g., at predetermined intervals) based on the first and second clock signals CLK1 and CLK2, respectively.

FIG. 5B illustrates a timing diagram of an example of a scan signal output from a scan driver included in the display device of FIG. 1.

Referring to FIG. 1, FIG. 3, FIG. 4, and FIG. 5A, the gate driver 10 may be the second scan driver 300. The first to fourth stages ST1 to ST4 may sequentially output second scan signals, respectively.

In some embodiments, within one frame period, the second scan start pulse SSP2 may overlap plurality of gate-on periods and a plurality of gate-off periods of the first and second clock signals CLK1 and CLK2 (e.g., the same plurality of gate-on periods and gate-off periods of the first and second clock signals CLK1 and CLK2 overlapped by the emission control start pulse SSP1). The first stage ST1 may output a second scan signal to a 1st second scan line S2_1 based on a second scan start pulse SSP2 and the first and second clock signals CLK1 and CLK2.

The second stage ST2 may output a second scan signal in which the second scan signal output to the 1st second scan line S2_1 is shifted by a horizontal period (e.g., a predetermined horizontal period) to a 2nd second scan line S2_2. Similarly, the third and fourth stages ST3 and ST4 may sequentially output the second scan signal at intervals (e.g., at predetermined intervals) based on the first and second clock signals CLK1 and CLK2, respectively.

Figure 6:
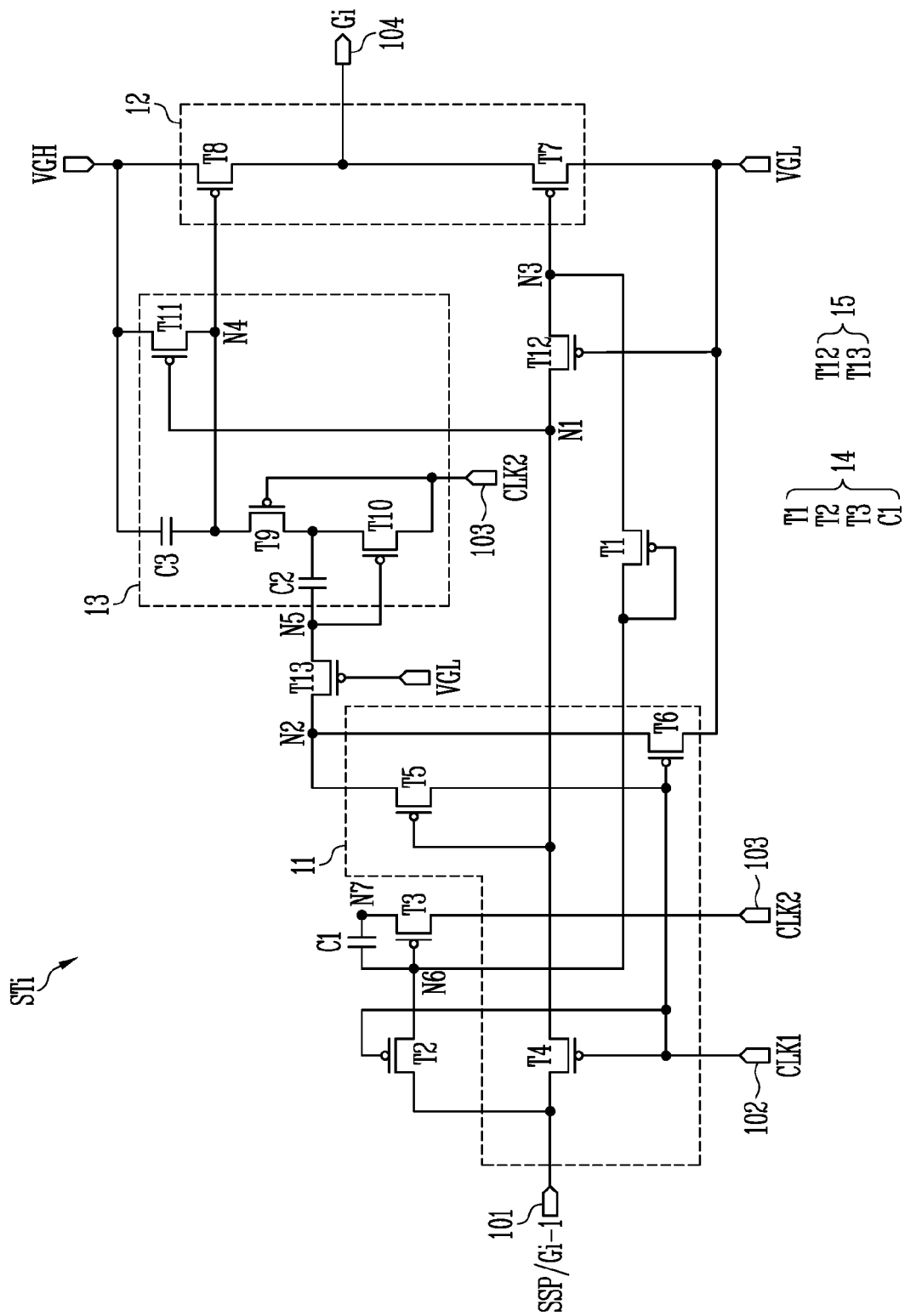
FIG. 6 illustrates a circuit diagram of an example of a stage included in the gate driver of FIG. 4.

FIG. 6 illustrates a circuit diagram of an example of a stage included in the gate driver of FIG. 4.

Referring to FIG. 4 and FIG. 6, an i-th stage STi (wherein i is a natural number) may include an input part 11, an output part 12, a first signal processing part 13, a second signal processing part 14, and a stabilizing part 15.

As shown in FIG. 6, the i-th stage STi (for example, an odd-numbered stage) in which the first clock signal CLK1 is supplied to the second input terminal 102 and the second clock signal CLK2 is supplied to the third input terminal 103 will be mainly described. However, this is merely an example, and in an (i+1)-th stage (for example, an even-numbered stage), the second clock signal CLK2 may be supplied to the second input terminal 102, and the first clock signal CLK1 may be supplied to the third input terminal 103.

In some embodiments, the start pulse SSP may be supplied to the first input terminal 101 of the first stage ST1, and a gate signal of a previous gate line may be supplied to the first input terminal 101 of the remaining stages.

Hereinafter, the i-th stage STi will be referred to as the stage STi and will be described.

The input part 11 may control a voltage of a first node N1 and a voltage of a second node N2 in response to signals supplied to the first input terminal 101 and the second input terminal 102. In some embodiments, the input part 11 may include a fourth transistor T4, a fifth transistor T5, and a sixth transistor T6.

The fourth transistor T4 may be connected between the first input terminal 101 and the first node N1. The fourth transistor T4 may include a gate electrode connected to the second input terminal 102. When the first clock signal CLK1 has a gate-on level (for example, a low level), the fourth transistor T4 may be turned on to electrically connect the first input terminal 101 and the first node N1.

The fifth transistor T5 may be connected between the second input terminal 102 and the second node N2. The fifth transistor T5 may include a gate electrode connected to the first node N1. The fifth transistor T5 may be turned on or off based on the voltage of the first node N1.

In some embodiments, the fifth transistor T5 may include a plurality of sub-transistors connected in series with each other. Each of the sub-transistors may include a gate electrode commonly connected to the first node N1 (for example, referred to as a dual gate structure). Therefore, current leakage due to the fifth transistor T5 may be reduced or minimized. However, this is merely an example, and one or more of the other transistors, in addition to the fifth transistor T5, may have a dual gate structure.

The sixth transistor T6 may be connected between the first power source VGL and the second node N2. A gate electrode of the sixth transistor T6 may be connected to the second input terminal 102. When the first clock signal CLK1 is supplied to the second input terminal 102, the sixth transistor T6 may be turned on to supply the voltage of the first power source VGL to the second node N2.

The output part 12 may supply the voltage of the first power source VGL, or the voltage of the second power source VGH, to the output terminal 104 based on a voltage of a third node N3 and a voltage of a fourth node N4. The voltage of the first power source VGL may correspond to the low level of the gate signal supplied to the i-th gate line Gi, and the voltage of the second power source VGH may correspond to the high level of the gate signal. The gate signal may be determined as an emission control signal or a scan signal in the display device (for example, the display device 1000 shown in FIG. 1).

In some embodiments, the output part 12 may include a seventh transistor T7 and an eighth transistor T8.

The seventh transistor T7 may be connected between the first power source VGL and the output terminal 104. A gate electrode of the seventh transistor T7 may be connected to the third node N3. The seventh transistor T7 may be turned on or off in response to the voltage of the third node N3. When the seventh transistor T7 is turned on, the gate signal supplied to the output terminal 104 may have a low level (for example, a gate-off voltage of an N-type transistor).

The eighth transistor T8 may be connected between the second power source VGH and the output terminal 104. A gate electrode of the eighth transistor T8 may be connected to the fourth node N4. The eighth transistor T8 may be turned on or off in response to the voltage of the fourth node N4. Here, when the eighth transistor T8 is turned on, the gate signal supplied to the output terminal 104 may have a high level (for example, a gate-on voltage of an N-type transistor).

The first signal processing part 13 may control the voltage of the fourth node N4. The first signal processing part 13 may supply the voltage of the second power source VGH to the fourth node N4 based on the voltage of the first node N1, or may electrically connect the second node N2 and the fourth node N4 through a fifth node N5 based on the second clock signal CLK2 supplied to the third input terminal 103.

For example, when the voltage of the second node N2 has a high level, the first signal processing part 13 may allow the eighth transistor T8 to be completely turned off by making the voltage of the fourth node N4 stably have a gate-off level (or high level). In addition, the first signal processing part 13 may control the voltage of the fourth node N4 to the gate-on level (or low level) by using the low level of the second node N2.

In some embodiments, the first signal processing part 13 may include a ninth transistor T9, a tenth transistor T10, an eleventh transistor T11, a second capacitor C2, and a third capacitor C3.

A first terminal of the second capacitor C2 may be connected to the fifth node N5. A second terminal of the second capacitor C2 may be connected to a point that is between the ninth transistor T9 and the tenth transistor T10.

The ninth transistor T9 may be connected between the second terminal of the second capacitor C2 and the fourth node N4. A gate electrode of the ninth transistor T9 may be connected to the third input terminal 103. The ninth transistor T9 may be turned on in response to the gate-on level (for example, low level) of the second clock signal CLK2 supplied to the third input terminal 103.

The tenth transistor T10 may be connected between the second terminal of the second capacitor C2 and the third input terminal 103. A gate electrode of the tenth transistor T10 may be connected to the fifth node N5. The tenth transistor T10 may be turned on or off in response to the voltage of the fifth node N5.

The eleventh transistor T11 may be connected between the second power source VGH and the fourth node N4. A gate electrode of the eleventh transistor T11 may be connected to the first node N1. The eleventh transistor T11 may be turned on or off in response to the voltage of the first node N1.

The third capacitor C3 may be connected between the second power source VGH and the fourth node N4. The third capacitor C3 charges the voltage applied to the fourth node N4 and stably maintains the voltage of the fourth node N4.

For example, when the seventh transistor T7 is turned on by the voltage of the first node N1 and/or the voltage of the third node N3, the eleventh transistor T11 may be turned on to supply the second power source VGH to the fourth node N4.

The stabilizing part 15 may be electrically connected between the input part 11 and the output part 12. The stabilizing part 15 may limit a voltage drop amount of the first node N1 and a voltage drop amount of the second node N2.

In some embodiments, when a voltage drop amount of the third node N3 is large (e.g., see 2L in FIG. 7), the stabilizing part 15 serves as a resistor, so that a voltage may be divided between the first node N1 and the third node N3. Therefore, even if a voltage change of the third node N3 is large, a sudden increase of a drain-source voltage of the fourth transistor T4 is reduced or prevented, and thus the fourth transistor T4 connected to the first node N1 may be protected.

In addition, the stabilizing part 15 may serve as a resistor when the voltage of the fifth node N5 significantly drops due to coupling of the second capacitor C2. Therefore, the fifth transistor T5 and the sixth transistor T6 connected to the second node N2 may be protected.

In some embodiments, the stabilizing part 15 may include a twelfth transistor T12 and a thirteenth transistor T13.

The twelfth transistor T12 may be connected between the first node N1 and the third node N3. A gate electrode of the twelfth transistor T12 may be connected to the first power source VGL. Therefore, the twelfth transistor T12 may have a turn-on state. When the voltage of the third node N3 drops to a voltage lower than the voltage of the first power source VGL, a voltage is divided by the twelfth transistor T12, and, therefore, the voltage of the first node N1 may be maintained relatively stable. For example, the voltage of the first node N1 is not lower than the voltage of the first power source VGL. Therefore, bias stress that may be applied to the fourth transistor T4 may be alleviated.

The thirteenth transistor T13 may be connected between the second node N2 and the fifth node N5. A gate electrode of the thirteenth transistor T13 may be connected to the first power source VGL. Thus, the thirteenth transistor T13 may have a turn-on state. When the voltage of the fifth node N5 drops to a voltage lower than the voltage of the first power source VGL by the coupling of the second capacitor C2, the thirteenth transistor T13 may act as a resistor to maintain the voltage of the fourth node N4 relatively stable. For example, the voltage of the fourth node N4 is not lower than the voltage of the first power source VGL. Therefore, bias stress that may be applied to the fifth transistor T5 and the sixth transistor T6 may be alleviated. Thus, the fifth transistor T5 and the sixth transistor T6 may be protected from voltage variations at the fifth node N5.

In some embodiments, the second signal processing part 14 may include a first transistor T1, a second transistor T2, a third transistor T3, and a first capacitor C1.

The first transistor T1 may be connected between the third node N3 and a sixth node N6. A gate electrode of the first transistor T1 may be connected to the sixth node N6. For example, the first transistor T1 may have a diode form connected from the third node N3 to the sixth node N6. Therefore, no current flows from the sixth node N6 to the third node N3. Accordingly, in a reverse diode connection state of the first transistor T1 in which a voltage of the sixth node N6 is greater than the voltage of the third node N3, the voltage of the third node N3 may be maintained relatively constant.

In some embodiments, the second transistor T2 may be connected between the first input terminal 101 and the sixth node N6. A gate electrode of the second transistor T2 may be connected to the second input terminal 102. When the first clock signal CLK1 is supplied to the second input terminal 102, the second transistor T2 may be turned on to provide a signal supplied to the first input terminal 101 to the sixth node N6.

When a high level signal is supplied to the first input terminal 101, because the first transistor T1 serves as a reverse diode, the voltage of the sixth node N6 does not affect the third node N3.

The third transistor T3 may be connected between the third input terminal 103 and a seventh node N7. The third transistor T3 may include a gate electrode connected to the sixth node N6. The third transistor T3 may be turned on or off in response to the voltage of the sixth node N6. When a low level signal is supplied to the first input terminal 101, the third transistor T3 maintains a turn-on state, and a voltage of the seventh node N7 may follow a change in the voltage level of the second clock signal CLK2.

The first capacitor C1 may be connected between the sixth node N6 and the seventh node N7. The voltage level of the sixth node N6 may swing in a range (in a predetermined range) by coupling the first capacitor C1 according to a voltage change of the seventh node N7. That is, the voltage of the sixth node N6 may follow the change in the voltage level of the second clock signal CLK2.

The first transistor T1 diode-connected between the sixth node N6 and the third node N3 may operate as a charge pump. For example, the voltage of the sixth node N6 having a form similar to an AC voltage may be converted into a form of the DC voltage at the third node N3 through the first transistor T1.

Therefore, despite the voltage change of the sixth node N6, the voltage of the third node N3 may be maintained at a constant level by the charge pump operation of the first transistor T1.

A specific operation and effect of the stage STi will be described in detail with reference to FIG. 7.

Figure 7:
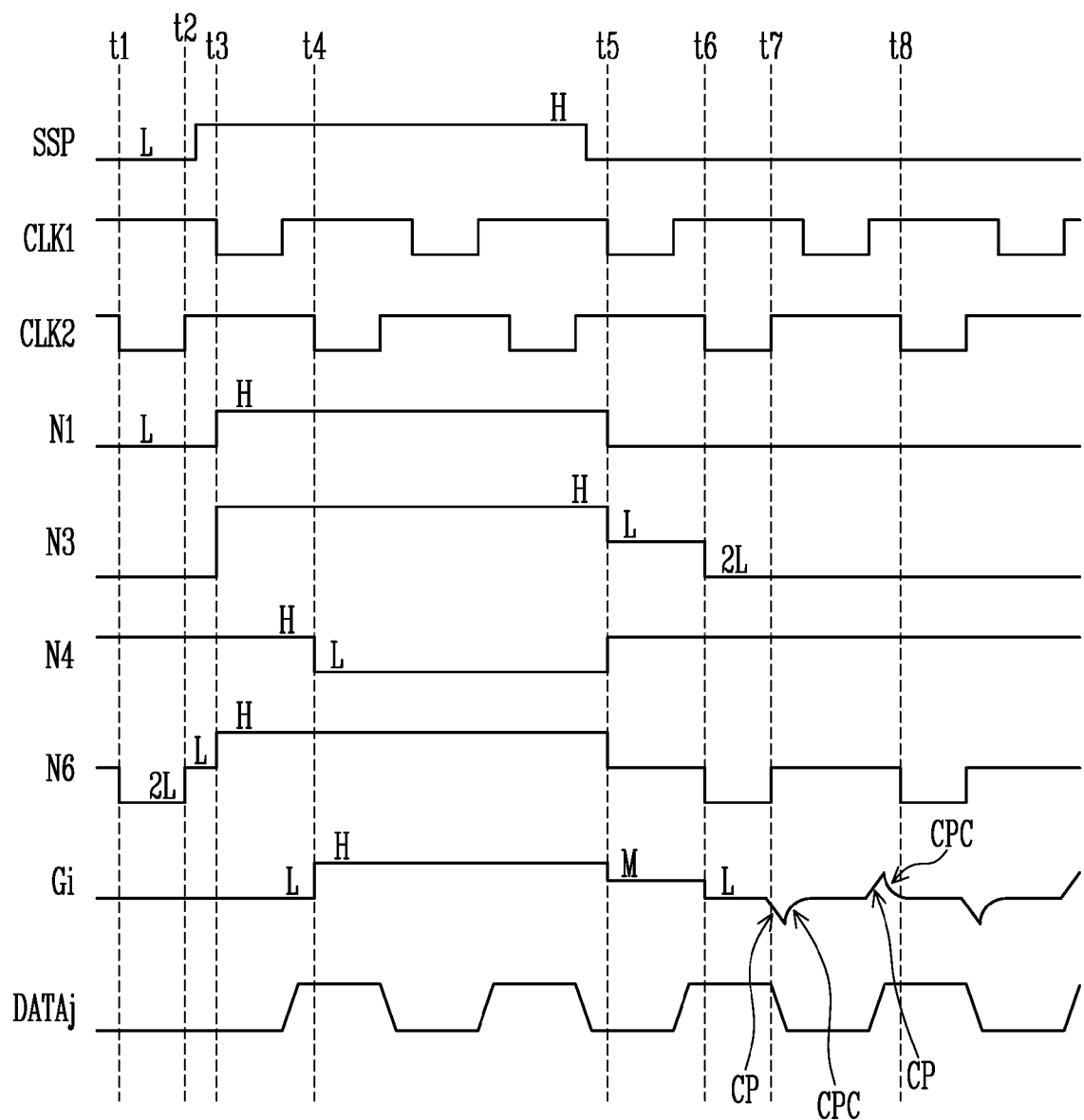
FIG. 7 illustrates a timing diagram of an example of an operation of the stage of FIG. 6.

FIG. 7 illustrates a timing diagram of an example of an operation of the stage of FIG. 6.

Referring to FIG. 1, FIG. 6, and FIG. 7, the first clock signal CLK1 and the second clock signal CLK2 are supplied at different timings. For example, the second clock signal CLK2 is set to a signal shifted by a half period (for example, one horizontal period) from the first clock signal CLK1.

The high level H (or high voltage) of the start pulse SSP may correspond to the voltage of the second power source VGH, and the low level L (or low voltage) of the start pulse SSP may correspond to the voltage of the first power source VGL. For example, the voltage of the first power source VGL may be about −8 V, and the voltage of the second power source VGH may be about 10 V. However, this is merely an example, and the voltage level of the start pulse is not limited thereto.

Meanwhile, the low level L of the third node N3 may be similar to a value obtained by adding an absolute value of a threshold voltage of the twelfth transistor T12 to the voltage of the first power source VGL. However, because the threshold voltage of the twelfth transistor T12 is very small compared to the voltage of the first power source VGL, the low level L of the third node N3, the voltage of the first power source VGL, the low level L of the start pulse SSP, and the low level L of the gate signal are assumed to be substantially the same as, or similar to, each other and will be described.

In addition, a 2-low level 2L may be a voltage level similar to 2*VGL.

In some embodiments, the start pulse SSP has a waveform for the output of the emission control signal according to FIG. 5A, or has a waveform for the output of the scan signal (for example, the second scan signal) according to FIG. 5B. That is, during one frame period, the start pulse SSP and the gate signal may overlap the previously mentioned plurality of gate-on periods and gate-off periods of the clock signals CLK1 and CLK2.

In addition, a data signal DATAj supplied to the j-th data line (Dj in FIG. 2) may be changed every one horizontal period. For example, the data signal DATAj may alternately have a high gray voltage and a low gray voltage in units of one horizontal period. In FIG. 7, it will be described with the assumption that a swing width of the data signal DATAj is large to describe coupling between the data line and the gate line.

Hereinafter, it will be described that when the clock signals CLK1 and CLK2 are supplied, the voltage (or the voltage of the low level L, the gate-on voltage) of the first power source VGL is supplied to the second input terminal 102 and the third input terminal 103, respectively, and when the clock signals CLK1 and CLK2 are not supplied, the voltage (or the voltage of the high level H, the gate-off voltage) of the second power source VGH is supplied to the second input terminal 102 and the third input terminal 103, respectively.

At a first time point t1, a second time point t2, a fifth time point t5, a sixth time point t6, and a seventh time point t7, the start pulse SSP has the low level L. At a third time point t3 and a fourth time point t4, the start pulse SSP has the high level. In addition, before the first time point t1, the voltage of the sixth node N6 has the low level L by the start pulse SSP of the low level L, and the third transistor T3 may be turned on.

The second clock signal CLK2 may be supplied to the third input terminal 103 at the first time point t1. The second clock signal CLK2 may be supplied to the seventh node N7 by the third transistor T3 of the turn-on state at the first time point t1. In this case, the second transistor T2 is in a turn-off state, and the voltage of the sixth node N6 may drop to the 2-low level 2L by coupling of the first capacitor C1.

In addition, at the first time point t1, the first transistor T1 is connected in a forward direction, and the voltage of the third node N3 may maintain the 2-low level 2L that is similar to the voltage of the sixth node N6. However, by the first transistor T1, the voltage of the third node N3 and the voltage of the sixth node N6 may have a difference that is as much as a threshold voltage of the first transistor T1.

Because the first node N1 has the low level L at the first time point t1, the voltage of the fourth node N4 may be the high level H by the turned on eleventh transistor T11.

The supply of the second clock signal CLK2 is stopped (that is, the second clock signal CLK2 is changed to the high level H) at the second time point t2, and the voltage of the seventh node N7 may be changed to the high level H by the third transistor T3 of the turn-on state. In this case, the second transistor T2 is in a turn-off state, and the voltage of the sixth node N6 may increase to the low level L by the coupling the first capacitor C1.

Because the voltage of the sixth node N6 is higher than the voltage of the third node N3 at the second time point t2, the first transistor T1 may function as a reverse diode. Therefore, the third node N3 may not be affected by the voltage change of the sixth node N6.

In this case, the seventh transistor T7 of the output part 12 performs a function of a pull-down buffer, and thus has a larger size than other transistors. Therefore, a relatively large parasitic capacitance may be formed between the gate electrode and the source electrode of the seventh transistor T7. Due to this parasitic capacitance, the voltage of the third node N3 may maintain the 2-low level 2L until the third time point t3.

After the second time point t2, the start pulse SSP may be changed to the high level H.

The first clock signal CLK1 may be supplied to the second input terminal 102 at the third time point t3. The second transistor T2, the fourth transistor T4, and the sixth transistor T6 may be turned on in response to the first clock signal CLK1.

When the second transistor T2 is turned on, the high level H of the start pulse SSP may be supplied to the sixth node N6. Accordingly, the third transistor T3 may be turned off. The turn-off state of the third transistor T3 and the high level H of the sixth node N6 may be maintained until the fifth time point t5.

When the fourth transistor T4 is turned on, the high level H of the start pulse SSP (or the gate signal of the previous stage) may be supplied to the first node N1. Accordingly, the voltage of the first node N1 and the voltage of the third node N3 may be changed to the high level H. Therefore, the seventh transistor T7 may be turned off by the voltage of the third node N3 of the high level H.

When the sixth transistor T6 is turned on, the voltage of the first power source VGL may be supplied to the second node N2 and may be supplied to the fifth node N5 through the thirteenth transistor T13. By the voltage of the low level (for example, L) of the fifth node N5 at the third time point t3, the tenth transistor T10 may be turned on, and the high level H of the second clock signal CLK2 may be supplied to the second terminal of the second capacitor C2.

In this case, because the ninth transistor T9 is in the turned off state, the voltage of the fourth node N4 may be maintained to the voltage of the second power source VGH (that is, the high level H) regardless of the voltage of the second terminal of the second capacitor C2.

The second clock signal CLK2 may be supplied to the third input terminal 103 at the fourth time point t4. The ninth transistor T9 may be turned on in response to the second clock signal CLK2. Because the voltage of the second terminal of the second capacitor C2 is decreased by the second clock signal CLK2 at the third time point t3, the voltage of the fifth node N5 may be decreased to the 2-low level 2L by the coupling of the second capacitor C2. Accordingly, the voltage of the fourth node N4 may be decreased, and the eighth transistor T8 may be turned on by the voltage of the fourth node N4.

When the eighth transistor T8 is turned on, the voltage of the second power source VGH may be supplied to the output terminal 104. Therefore, the gate signal may be output at the high level H.

Thereafter, during the period in which the start pulse SSP is supplied in the high level H, the stage STi may output the high level gate signal. Thereafter, before the fifth time point t5, the start pulse SSP may be changed back to the low level L.

The first clock signal CLK1 may be supplied at the fifth time point t5. The second transistor T2, the fourth transistor T4, and the sixth transistor T6 may be turned on in response to the first clock signal CLK1.

When the second transistor T2 is turned on, the low level L of the start pulse SSP may be supplied to the sixth node N6. Accordingly, the third transistor T3 may be turned on. The turn-on state of the third transistor T3 may be maintained until the third time t3 of a next frame returns again.

When the fourth transistor T4 is turned on, the low level L of the start pulse SSP (or the gate signal of the previous stage) may be supplied to the first node N1. The voltage of the third node N3 may be changed to the low level L through the twelfth transistor T12 of the turn-on state. Accordingly, the seventh transistor T7 may be turned on by the voltage of the low level L of the third node N3.

In this case, because the low level L that is similar to that of the voltage of the first power source VGL is supplied to the gate electrode of the seventh transistor T7, the gate signal output to the output terminal 104 through the seventh transistor T7 may have an intermediate level M. The intermediate level M may be higher than that of the voltage of the first power source VGL. For example, the intermediate level M may be a level of voltage of about VGL+2|Vth|.

Meanwhile, the eleventh transistor T11 may be turned on by the voltage of the low level L of the first node N1 at the fifth time t5. When the eleventh transistor T11 is turned on, the voltage of the second power source VGH may be supplied to the fourth node N4, and the eighth transistor T8 may be turned off. Thereafter, the high level H of the fourth node N4 may be maintained until the fourth time t4 of a next frame returns again.

Thereafter, the second clock signal CLK2 may be supplied to the third input terminal 103 at the sixth time point t6. The second clock signal CLK2 may be supplied to the seventh node N7 by the third transistor T3 of the turn-on state at the sixth time point t6. In this case, the second transistor T2 is in the turn-off state, and the voltage of the sixth node N6 may drop to the 2-low level 2L by the coupling of the first capacitor C1.

In addition, at the sixth time point t6, the first transistor T1 is connected in a forward direction, and the voltage of the third node N3 may drop to the 2-low level 2L similar to the voltage of the sixth node N6. However, by the first transistor T1, the voltage of the third node N3 and the voltage of the sixth node N6 may have a difference that is as much as the threshold voltage of the first transistor T1.

In this case, because the 2-low level 2L is supplied to the gate electrode of the seventh transistor T7, the gate signal output to the output terminal 104 through the seventh transistor T7 may have the low level L.

The supply of the second clock signal CLK2 is stopped (that is, the second clock signal CLK2 is changed to the high level H) at the seventh time point t7, and the voltage of the seventh node N7 may be changed to the high level H by the third transistor T3 of the turn-on state. In this case, the second transistor T2 is in the turn-off state, and the voltage of the sixth node N6 may increase to the low level L by the coupling the first capacitor C1.

Because the voltage of the sixth node N6 is higher than the voltage of the third node N3 at the seventh time point t7, the first transistor T1 may be reversely diode-connected. Therefore, the third node N3 may not be affected by the voltage change of the sixth node N6. Due to parasitic capacitance of the seventh transistor T7, the voltage of the third node N3 may be maintained at the 2-low level 2L until an eighth time t8.

Thereafter, operations of the first to third transistors T1 to T3 and of the first capacitor C1 at the eighth time t8 may be the same as those at the sixth time t6. Accordingly, the voltage of the third node N3 may be maintained at the 2-low level 2L by the first transistor T1 forward diode-connected due to the voltage of the sixth node N6 of the 2-low level 2L.

The operation between the sixth time point t6 and the eighth time point t8 may then be repeated until the third time point t3 returns again. That is, the first transistor T1 may perform an operation such as that of a charge pump that converts an AC voltage (L⇔2L) into a DC voltage (for example, 2L) between the third node N3 and the sixth node N6. Therefore, the voltage of the third node N3 from the sixth time point t6 may be maintained at the 2-low level 2L.

Meanwhile, according to a voltage variation (voltage increase and/or voltage decrease) of the data signal DATAj supplied to the data line, coupling error CP may occur by unintended coupling due to parasitic capacitance between the i-th gate line Gi and the data line. For example, the low level L of the gate signal may be greatly affected by the coupling.

The stage STi of the gate driver (e.g., the gate driver 10 of FIG. 4) according to some embodiments of the present disclosure may stably maintain the voltage of the third node N3 at the 2-low level 2L, through the same operation as that of the charge pump of the second signal processing part 14 including the first transistor T1. Accordingly, the coupling error CP between the data line and the gate line may immediately be compensated (denoted by CPC in FIG. 7) by the voltage of the third node N3 of the 2-low level 2L, which is sufficiently low. Therefore, the low level L of the gate signal output from the gate line Gi may be maintained to be relatively stable.

Accordingly, luminance deviation, such as crosstalk due to the coupling between the data line and the gate line, may be ameliorated.

Figure 8:
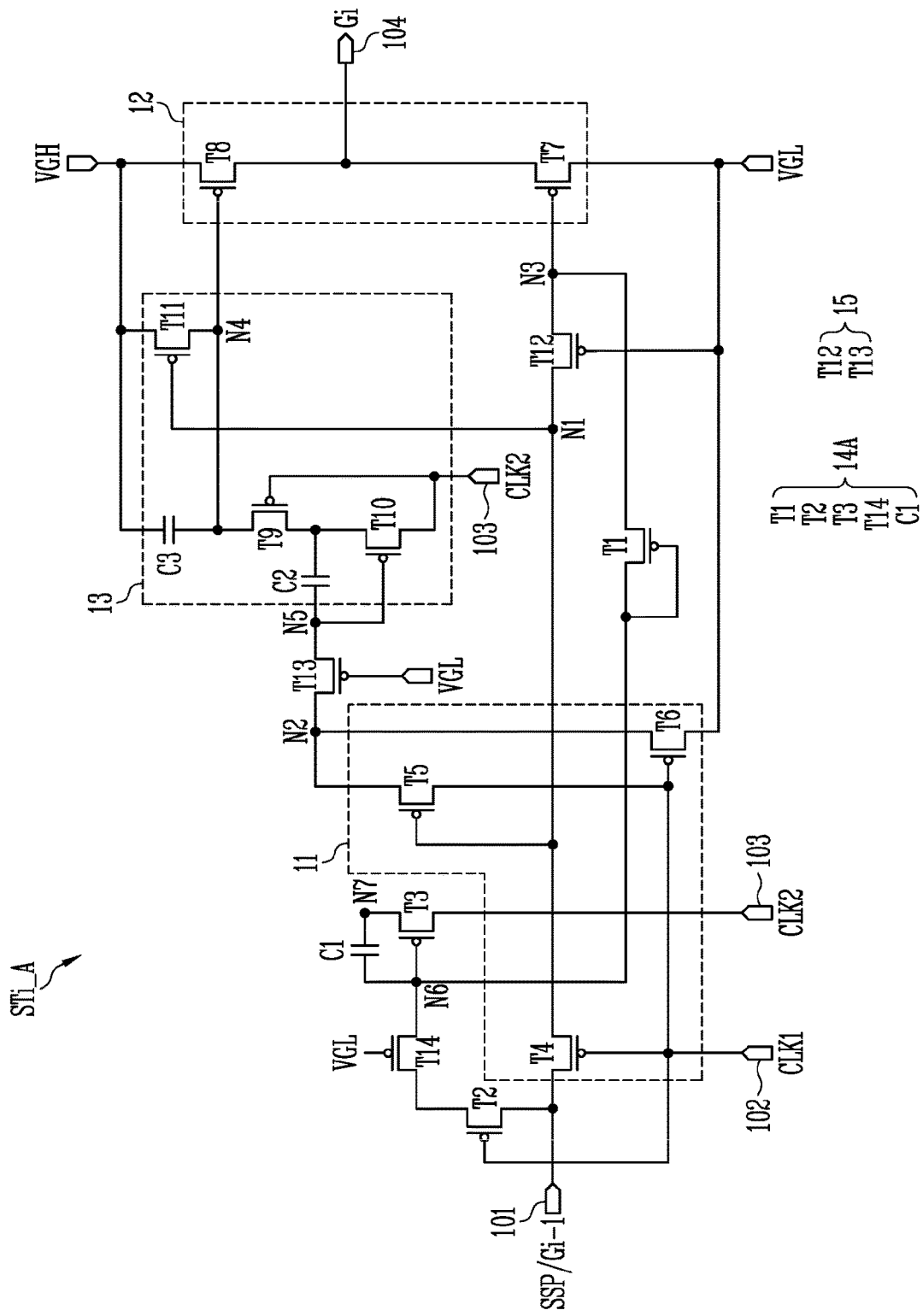
FIG. 8 illustrates a circuit diagram of another example of a stage included in the gate driver of FIG. 4.

FIG. 8 illustrates a circuit diagram of another example of a stage included in the gate driver of FIG. 4.

In FIG. 8, the same reference numerals are used for the constituent elements described with reference to FIG. 6, and redundant descriptions of these constituent elements will be omitted. In addition, a stage STi_A of FIG. 8 may have substantially the same configuration as, or similar configuration to, the stage STi of FIG. 6 except for a configuration of a fourteenth transistor T14.

Referring to FIG. 7 and FIG. 8, the stage STi_A may include the input part 11, the output part 12, the first signal processing part 13, a second signal processing part 14A, and the stabilizing part 15.

The second signal processing part 14A may stably maintain the 2-low level 2L of the third node N3 based on the operation (for example, the charge pump operation) of the first transistor T1 that is diode-connected between the third node N3 and the sixth node N6.

The second signal processing part 14A may include the first transistor T1, the second transistor T2, the third transistor T3, and the first capacitor C1. In some embodiments, the second signal processing part 14A may further include the fourteenth transistor T14.

The fourteenth transistor T14 may be connected between the second transistor T2 and the sixth node N6. A gate electrode of the fourteenth transistor T14 may receive the voltage of the first power source VGL. Therefore, the fourteenth transistor T14 may have a turn-on state. When the voltage of the sixth node N6 decreases to a voltage that is lower than the voltage of the first power source VGL (for example, the 2-low level 2L), the voltage is divided by the fourteenth transistor T14, and the voltage of the node between the second transistor T2 and the fourteenth transistor T14 may be maintained to be relatively stable. For example, a drain voltage of the second transistor T2 is not lower than the voltage of the first power source VGL. Therefore, bias stress that may be otherwise applied to the second transistor T2 may be alleviated.

That is, the fourteenth transistor T14 may perform substantially the same functions as the twelfth transistor T12 and the thirteenth transistor T13 of the stabilizing part 15. Therefore, the second transistor T2 is protected from the voltage variation at the sixth node N6, and the stage STi_A may operate more stably.

Meanwhile, because the voltage change of the third node N3 according to the operation of the stage STi_A and the output to the gate line Gi are substantially the same as the waveform of FIG. 7, a description thereof will be omitted.

Figure 9:
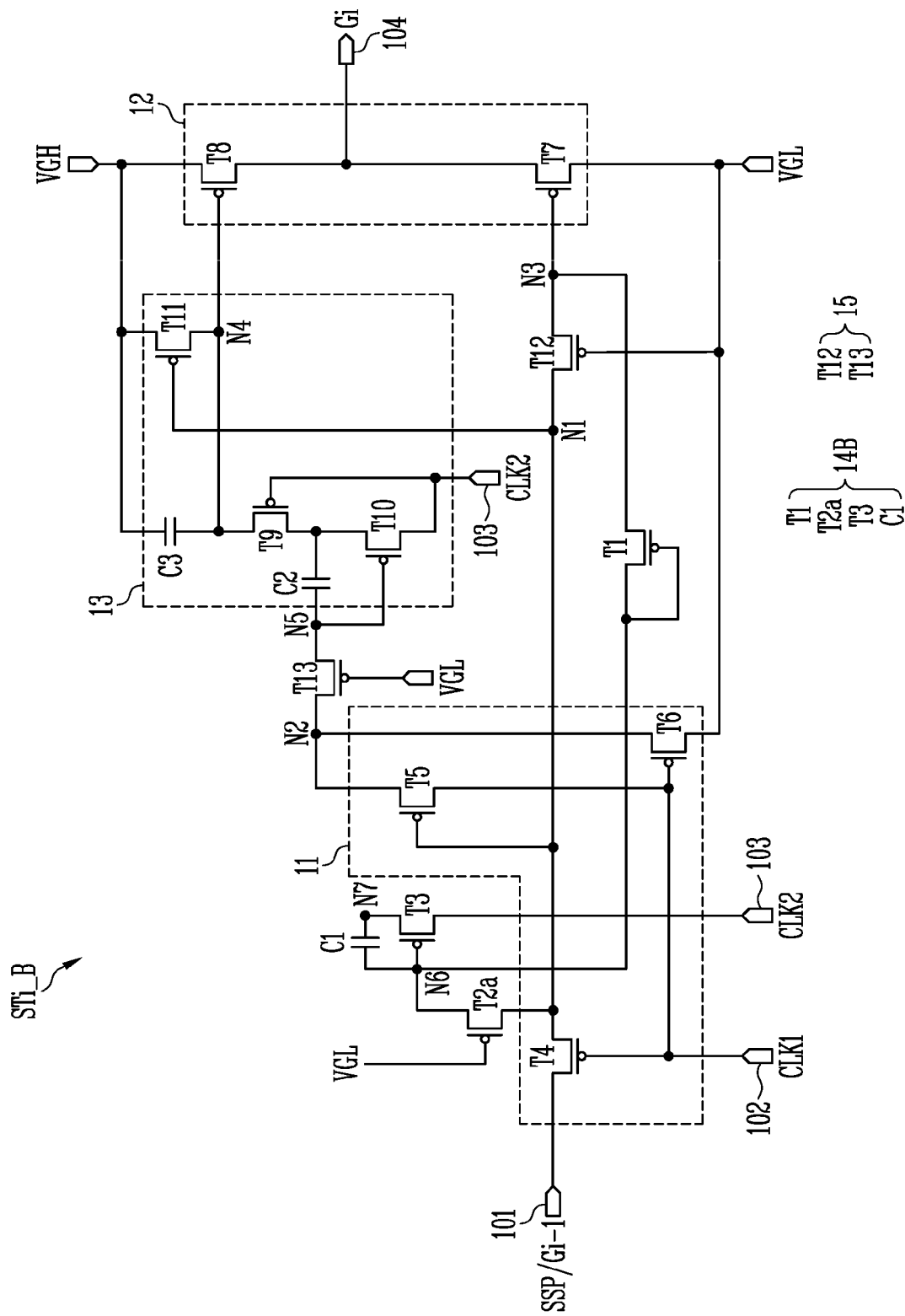
FIG. 9 illustrates a circuit diagram of another example of a stage included in the gate driver of FIG. 4.

FIG. 9 illustrates a circuit diagram of another example of a stage included in the gate driver of FIG. 4.

In FIG. 9, the same reference numerals are used for the constituent elements described with reference to FIG. 6, and redundant descriptions of these constituent elements will be omitted. In addition, a stage STi_B of FIG. 9 may have substantially the same configuration as, or similar configuration to, the stage STi of FIG. 6 except for a configuration of a second transistor T2a.

Referring to FIG. 7 and FIG. 9, the stage STi_B may include the input part 11, the output part 12, a first signal processing part 13, a second signal processing part 14B, and the stabilizing part 15.

The second signal processing part 14B may include the first transistor T1, the second transistor T2a, the third transistor T3, and the first capacitor C1.

In some embodiments, the second transistor T2a may be connected between the first node N1 and the sixth node N6. A gate electrode of the second transistor T2a may receive the voltage of the first power source VGL. Therefore, the second transistor T2a may have a turn-on state.

Only when the first clock signal CLK1 is supplied and the fourth transistor T4 is turned on, the second transistor T2a may transmit the start pulse SSP, or the gate signal of the previous gate line Gi−1, that is supplied to the first input terminal 101 to the sixth node N6. Accordingly, the bias stress for the second transistor T2 may also be reduced, and the number of transistors may be reduced when compared to the number of transistors of the stage STi_A of FIG. 8.

Figure 10:
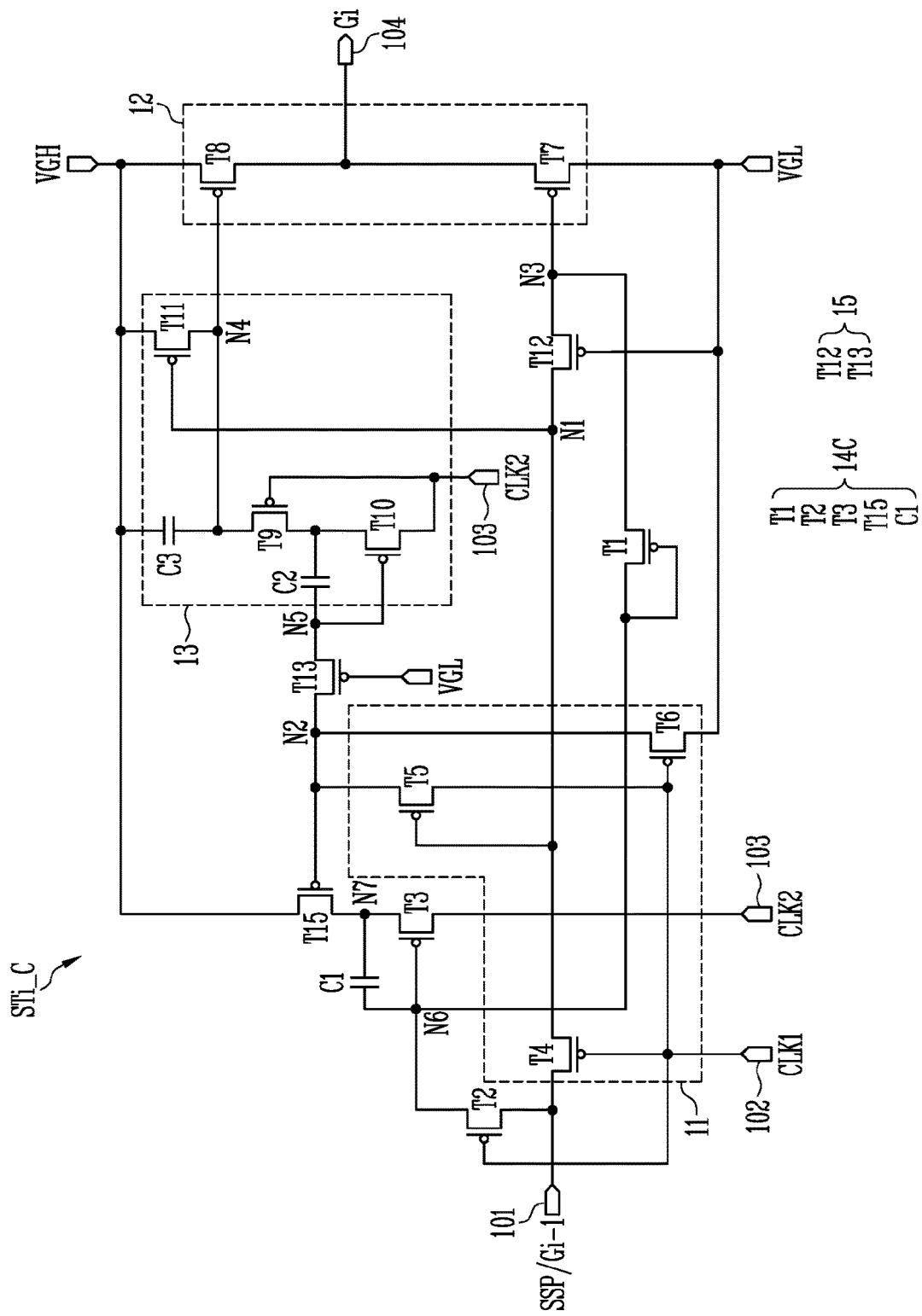
FIG. 10 illustrates a circuit diagram of another example of a stage included in the gate driver of FIG. 4.

FIG. 10 illustrates a circuit diagram of another example of a stage included in the gate driver of FIG. 4.

In FIG. 10, the same reference numerals are used for the constituent elements described with reference to FIG. 6, and redundant descriptions of these constituent elements will be omitted. In addition, a stage STi_C of FIG. 10 may have substantially the same configuration as, or similar configuration to, the stage STi of FIG. 6 except for a configuration of a fifteenth transistor T15.

Referring to FIG. 7 and FIG. 10, the stage STi_C may include the input part 11, the output part 12, the first signal processing part 13, a second signal processing part 14C, and the stabilizing part 15.

In some embodiments, the second signal processing part 14C may include the first transistor T1, the second transistor T2, the third transistor T3, the first capacitor C1, and the fifteenth transistor T15.

The fifteenth transistor T15 may be connected between the second power source VGH and the seventh node N7. A gate electrode of the fifteenth transistor T15 may be connected to the second node N2. When the fifteenth transistor T15 is turned on, the voltage of the second power source VGH may be supplied to the seventh node N7.

That is, the fifteenth transistor T15 may stably supply the voltage of the second power source VGH to the seventh node N7 at the start-up of the stage STi_C and/or at the output of the gate signal of the high level H. Accordingly, the coupling (or boosting) operation of the first capacitor C1 may be further improved.

Figure 11:
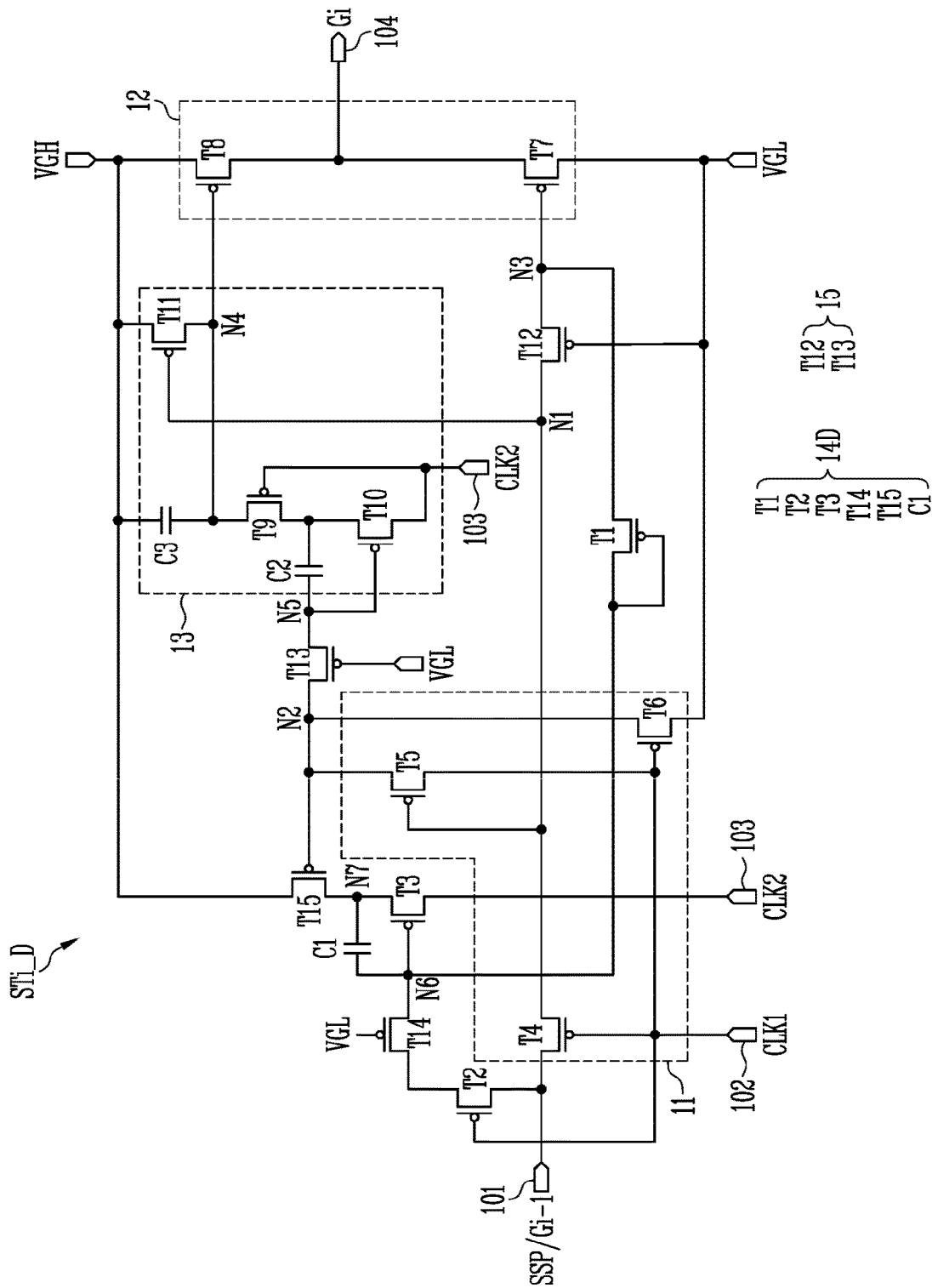
FIG. 11 illustrates a circuit diagram of another example of a stage included in the gate driver of FIG. 4.

FIG. 11 illustrates a circuit diagram of another example of a stage included in the gate driver of FIG. 4.

In FIG. 11, the same reference numerals are used for the constituent elements described with reference to FIG. 8 and FIG. 10, and redundant descriptions of these constituent elements will be omitted.

Referring to FIG. 7 and FIG. 11, a stage STi_D may include the input part 11, the output part 12, the first signal processing part 13, a second signal processing part 14D, and the stabilizing part 15.

In some embodiments, the second signal processing part 14D may include the first transistor T1, the second transistor T2, the third transistor T3, the first capacitor C1, the fourteenth transistor T14, and the fifteenth transistor T15.

Because the fourteenth transistor T14 and the fifteenth transistor T15 have been described above with reference to FIG. 8 and FIG. 10, respectively, redundant descriptions will be omitted.

Figure 12:
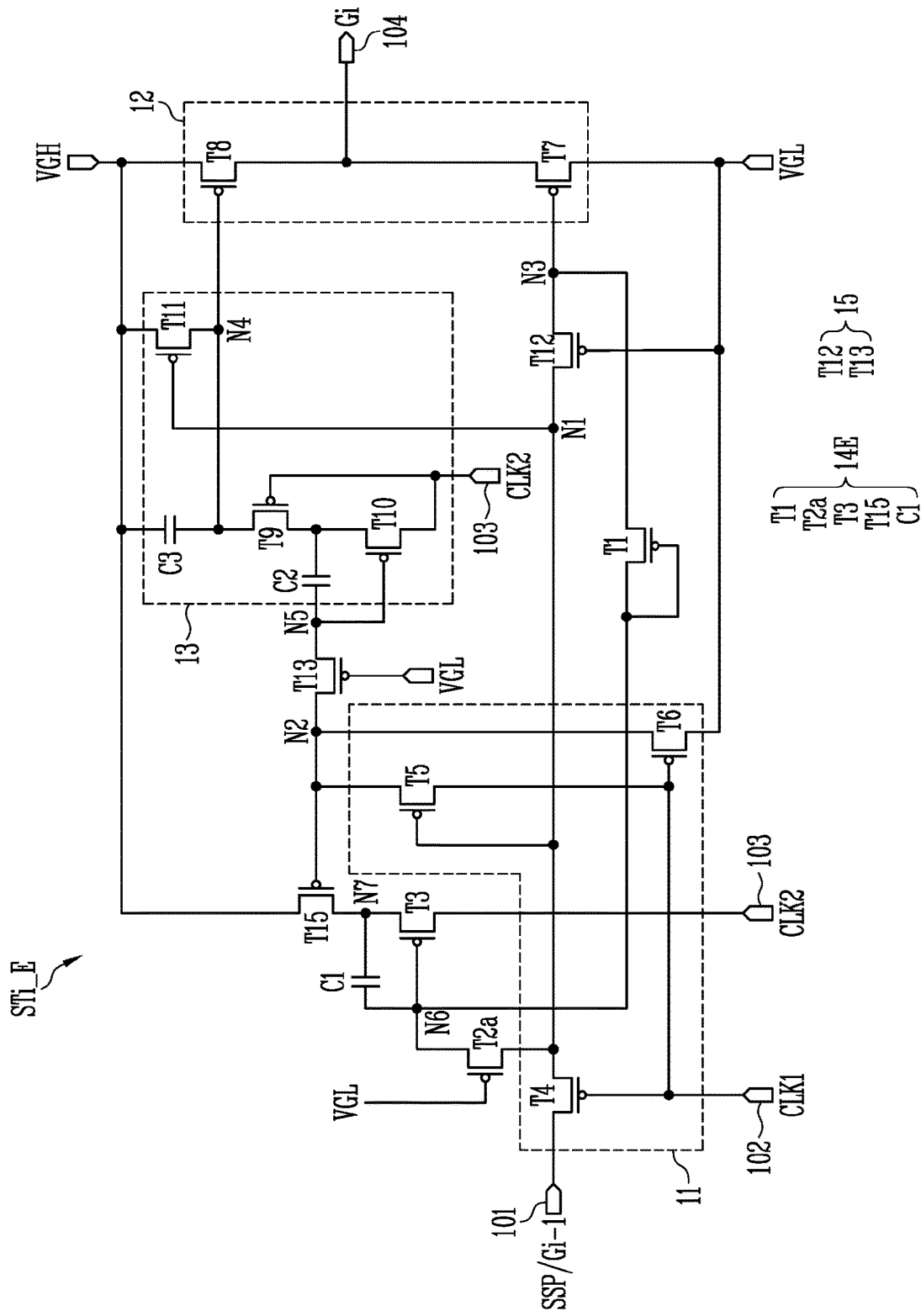
FIG. 12 illustrates a circuit diagram of another example of a stage included in the gate driver of FIG. 4.

FIG. 12 illustrates a circuit diagram of another example of a stage included in the gate driver of FIG. 4.

In FIG. 12, the same reference numerals are used for the constituent elements described with reference to FIG. 9 and FIG. 10, and redundant descriptions of these constituent elements will be omitted.

Referring to FIG. 7 and FIG. 12, a stage STi_E may include the input part 11, the output part 12, the first signal processing part 13, a second signal processing part 14E, and the stabilizing part 15.

In some embodiments, the second signal processing part 14E may include the first transistor T1, the second transistor T2a, the third transistor T3, the first capacitor C1, and the fifteenth transistor T15.

Because the second transistor T2a and the fifteenth transistor T15 have been described above with reference to FIG. 9 and FIG. 10, respectively, redundant descriptions will be omitted.

Figure 13B:
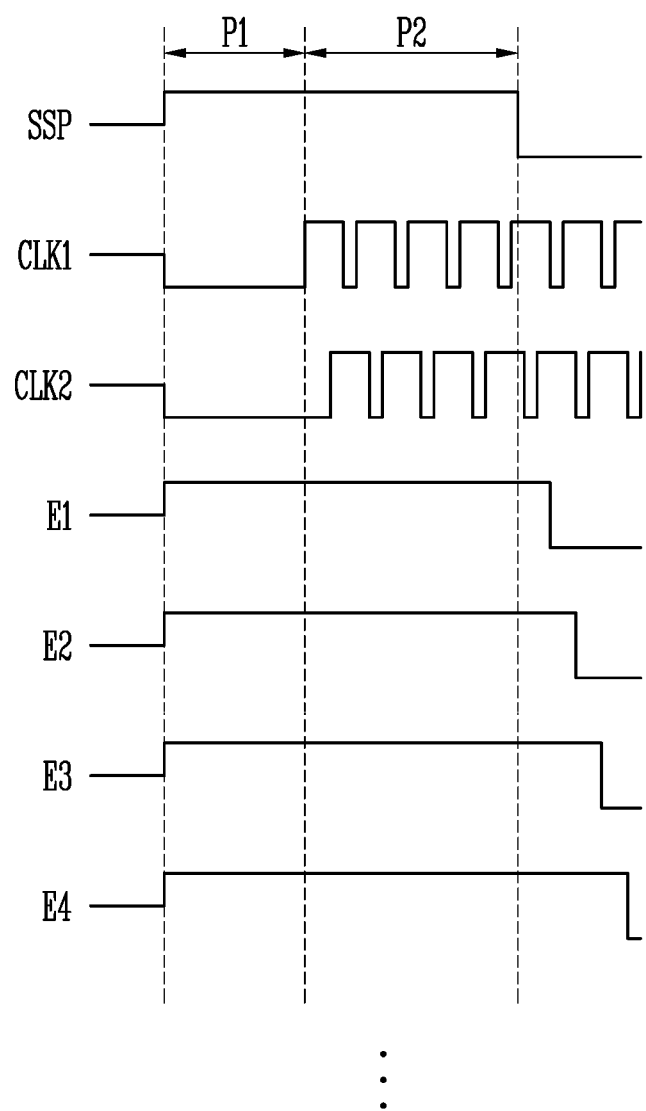
FIG. 13B illustrates a timing diagram of an example of an operation of the gate driver of FIG. 4.

FIG. 13A illustrates a circuit diagram of an example of a stage included in the gate driver of FIG. 4, and FIG. 13B illustrates a timing diagram of an example of an operation of the gate driver of FIG. 4.

In FIG. 13A, the same reference numerals are used for the constituent elements described with reference to FIG. 6, and redundant descriptions of these constituent elements will be omitted. In addition, stages ST1' and ST2' of FIG. 13A may have substantially the same configuration as, or similar configuration to, the stage STi of FIG. 6 except for configurations of a nineteenth transistor T19 and a twentieth transistor T20.

Hereinafter, in FIG. 13A to FIG. 18, a gate driver and stages will be described as being a configuration of the emission driver 400 that outputs an emission control signal. However, some embodiments of the present disclosure is not limited thereto, and the gate driver and the stages may be a configuration of the scan driver.

Referring to FIGS. 1, 2, 4, 13A, and 13B, each of the stages ST1' and ST2' may include the input part 11, the output part 12, the first signal processing part 13, the second signal processing part 14, a stabilizing part 15, and an initializing part 16.

The initializing part 16 may supply the voltage of the second power source VGH to the first node N1 during an initializing period P1 (e.g., a preset initializing period). That is, the initializing period P1 may be a period during which the display device 1000 is initially driven, which is a period before the pixels PX are substantially driven. All signals before the initializing period P1 may have a ground level. During the initializing period P1, the start pulse SSP of the high level may be supplied, and the first and second clock signals CLK1 and CLK2 of the low level may be supplied.

That is, in the initializing period P1, both the first clock signal CLK1 and the second clock signal CLK2 may have the low level. For example, a length of the initializing period P1, in which both the first clock signal CLK1 and the second clock signal CLK2 have the low level, may be set longer than that of a period during which the first clock signal CLK1 and/or the second clock signal CLK2 have the low level (for example, a period between the first time point t1 and the second time point t2 in FIG. 7) in the driving for displaying an image as shown in FIG. 7.

In the initializing period P1, all the stages included in the gate driver 10 may concurrently, simultaneously, or substantially simultaneously output a high level emission control signal. The fifth and sixth pixel transistors M5 and M6 of the pixels PX may be turned off by the high level emission control signal, thus the pixel PX may not emit light. That is, the pixels PX may be initialized to a state for preparing light emission and image display, and then, the display device 1000 may display an image by driving as described with reference to FIG. 7.

The initializing part 16 may include the nineteenth transistor T19 and the twentieth transistor T20. The nineteenth transistor T19 and the twentieth transistor T20 may be connected in series between the second power source VGH and the first node N1.

In some embodiments, the nineteenth transistor T19 may be connected between the first node N1 and one electrode of the twentieth transistor T20. The gate electrode of the nineteenth transistor T19 may be connected to the second node N2.

The twentieth transistor T20 may be connected between the second power source VGH and one electrode of the nineteenth transistor T19. A gate electrode of the twentieth transistor T20 may be connected to the third input terminal 103.

In some embodiments, as shown in FIG. 13A and FIG. 13B, the second transistor T2, the fourth transistor T4, and the sixth transistor T6 may be turned on by the first clock signal CLK1 in the initializing period P1.

When the second transistor T2 is turned on, the voltage of the sixth node N6 may have the high level. Accordingly, the third transistor T3 is turned off, and the second signal processing part 14 does not affect the voltage of the third node N3.

When the fourth transistor T4 is turned on, the voltage of the first node N1 and the voltage of the third node N3 may have the high level. Accordingly, the fifth transistor T5, the seventh transistor T7, and the eleventh transistor T11 may be turned off.

When the sixth transistor T6 is turned on, the voltage of the first power source VGL (that is, low level) may be supplied to the second node N2 and the fifth node N5. Therefore, the tenth transistor T10 may be turned on.

The low level of the second clock signal CLK2 may be supplied to the fourth node N4 by the turned on ninth and tenth transistors T9 and T10 so that the eighth transistor T8 may be turned on. Therefore, the voltage of the second power source VGH may be supplied to the output terminal 104.

In addition, in the initializing period P1, both the nineteenth transistor T19 and the twentieth transistor T20 may be turned on, and the voltage of the second power source VGH may be supplied to the first node N1. Therefore, in the initializing period P1, the seventh transistor T7 of each of all the stages including the first stage ST1' and the second stage ST2' is turned off, and the emission control signal of the high level may be stably outputted.

In some embodiments, as shown in FIG. 13B, the start pulse SSP (for example, the emission control start pulse) may have the high level during the initializing period P1 and a maintaining period P2. The first clock signal CLK1 and the second clock signal CLK2 may have the low level during the initializing period P1, and may be cyclically supplied (e.g., supplied in a predetermined cycle) that repeats the high level and the low level during the maintaining period P2.

Meanwhile, the maintaining period P2 may be omitted, and the driving illustrated in FIG. 7 for displaying an image may be performed after the start pulse SSP transitions to the low level.

In addition, because a period before the initializing period P1 is a period before the display device 1000 or the emission driver 400 is driven, the start pulse SSP, the first clock signal CLK1, the second clock signal CLK2, and the emission control signal may have the ground level in the period before the initializing period P1.

During the initializing period P1, because both the first clock signal CLK1 and the second clock signal CLK2 have the low level, the fourth nodes N4 of the first and second stages ST1' and ST2' may have the low level voltage, and the third nodes N3 may have the high level voltage. Accordingly, the high level emission control signal may be simultaneously output to the emission control lines E1 to E4 during the initializing period P1.

During the maintaining period P2, because the start pulse SSP maintains the high level, the emission control signal may also maintain the high level.

Thereafter, when the start pulse SSP transitions to the low level, the emission control signals output to the emission control lines E1 to E4 in synchronization with the first clock signal CLK1 or the second clock signal CLK2 may be sequentially changed to the low level.

In FIG. 13B, the emission control signal is shown to drop from the high level to the low level at a time (e.g., is shown to sharply drop), but the disclosure is not limited thereto. For example, the emission control signal may decrease in a step form as shown in FIG. 5A.

Meanwhile, when an image is displayed, the initializing part 16 does not affect the operation of the stages ST1' and ST2', and the driving as illustrated in FIG. 7 may be performed. For example, when the stages ST1' and ST2' are operated to display an image, the low level emission control signal may be outputted, and the nineteenth transistor T19 may be turned off by the high level voltage of the second node N2. Therefore, because the nineteenth transistor T19 blocks the effect of coupling due to the switching of the twentieth transistor T20, the stages ST1' and ST2' may stably operate.

As shown in FIG. 13A, the output terminal 104 of the first stage ST1' may be connected to the input terminal 101 of the second stage ST2' by a carry line CR (e.g., a predetermined carry line). The high level emission control signal/gate signal supplied to the first emission control line E1/the first gate line G1 may be supplied to the third node N3 through the first node N1 of the first stage ST2'. Similarly, the high level emission control signal/gate signal supplied to the second emission control line E2/the second gate line G2 may be supplied to the third stage.

Due to an initial driving RC delay occurring due to the carry line CR, the high level emission control signal might not be completely transmitted to the last stage. In this case, the seventh transistor T7 and the eighth transistor T8 may be concurrently, simultaneously, or substantially simultaneously turned on in a stage (e.g., a predetermined stage), and the voltage level of the emission control signal may be decreased so that an abnormal light emission phenomenon, such as flashing of the pixels PX, may occur.

On the other hand, in some embodiments of the present disclosure, the initializing part 16 directly transmits the voltage of the second power source VGH to the first node N1 during the initializing period P1, so that the high level voltage may be immediately supplied to the first node N1 and the third node N3. Therefore, during the initializing period P1, the seventh transistor T7 may be completely turned off, and flashing due to unintentional light emission of the pixels PX may be reduced or prevented.

Figure 14A:
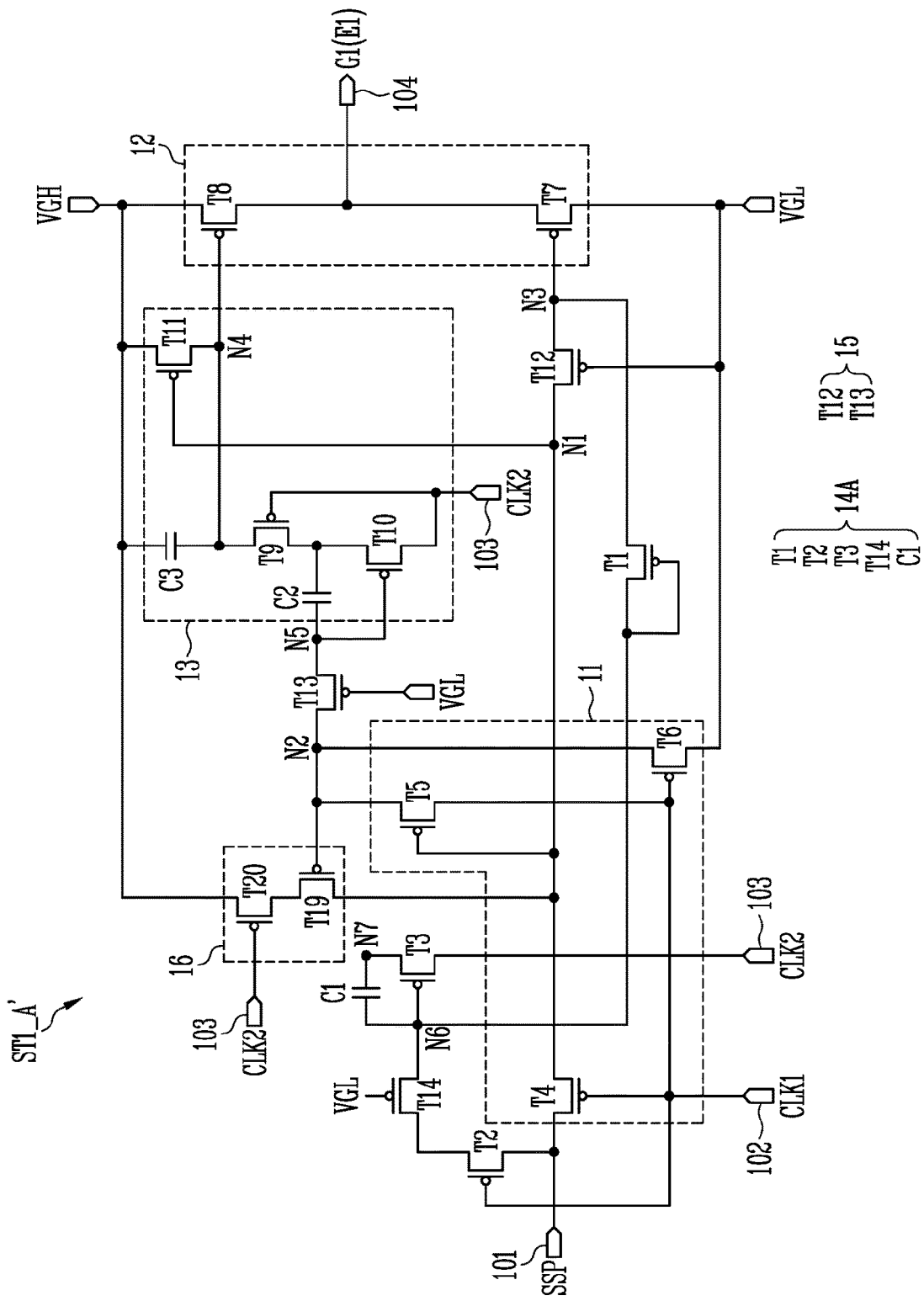
FIG. 14A and FIG. 14B illustrate circuit diagrams of examples of a stage included in the gate driver of FIG. 4.
Figure 14B:
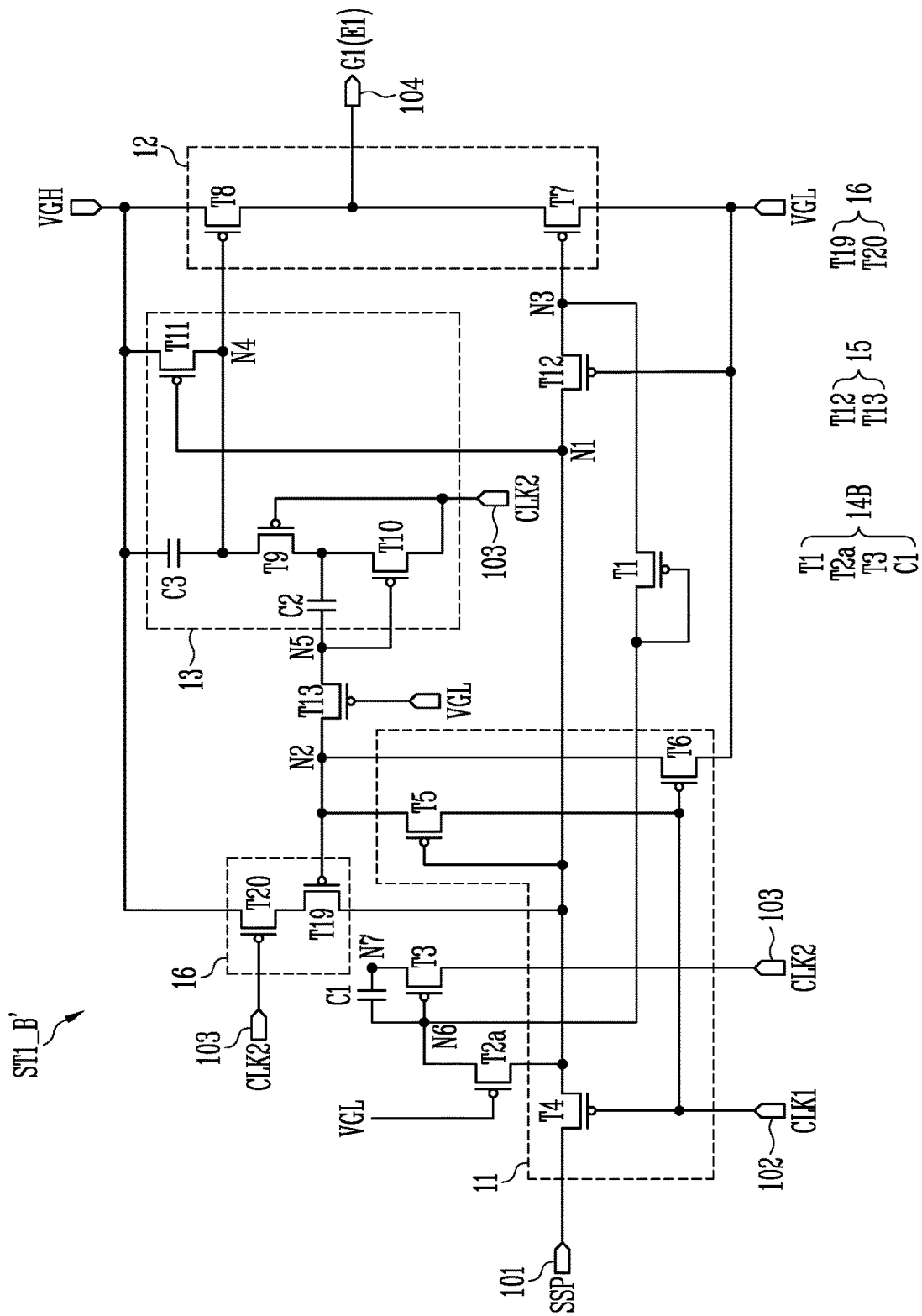

FIG. 14A and FIG. 14B illustrate circuit diagrams of examples of a stage included in the gate driver of FIG. 4.

In FIG. 14A and FIG. 14B, the same reference numerals are used for the constituent elements described with reference to FIG. 8, FIG. 9, and FIG. 13A, and redundant descriptions of these constituent elements will be omitted.

Referring to FIG. 14A and FIG. 14B, each of stages ST1_A' and ST1_B' may include the input part 11, the output part 12, the first signal processing part 13, second signal processing parts 14A or 14B, the stabilizing part 15, and the initializing part 16.

The initializing part 16 directly transmits the voltage of the second power source VGH to the first node N1 during the initializing period, so that the high level voltage may be immediately supplied to the first node N1 and the third node N3.

In other embodiments, the initializing part 16 may be included in the stages STi_C, STi_D, and STi_E of FIG. 10 to FIG. 12 with substantially the same structure.

Figure 15A:
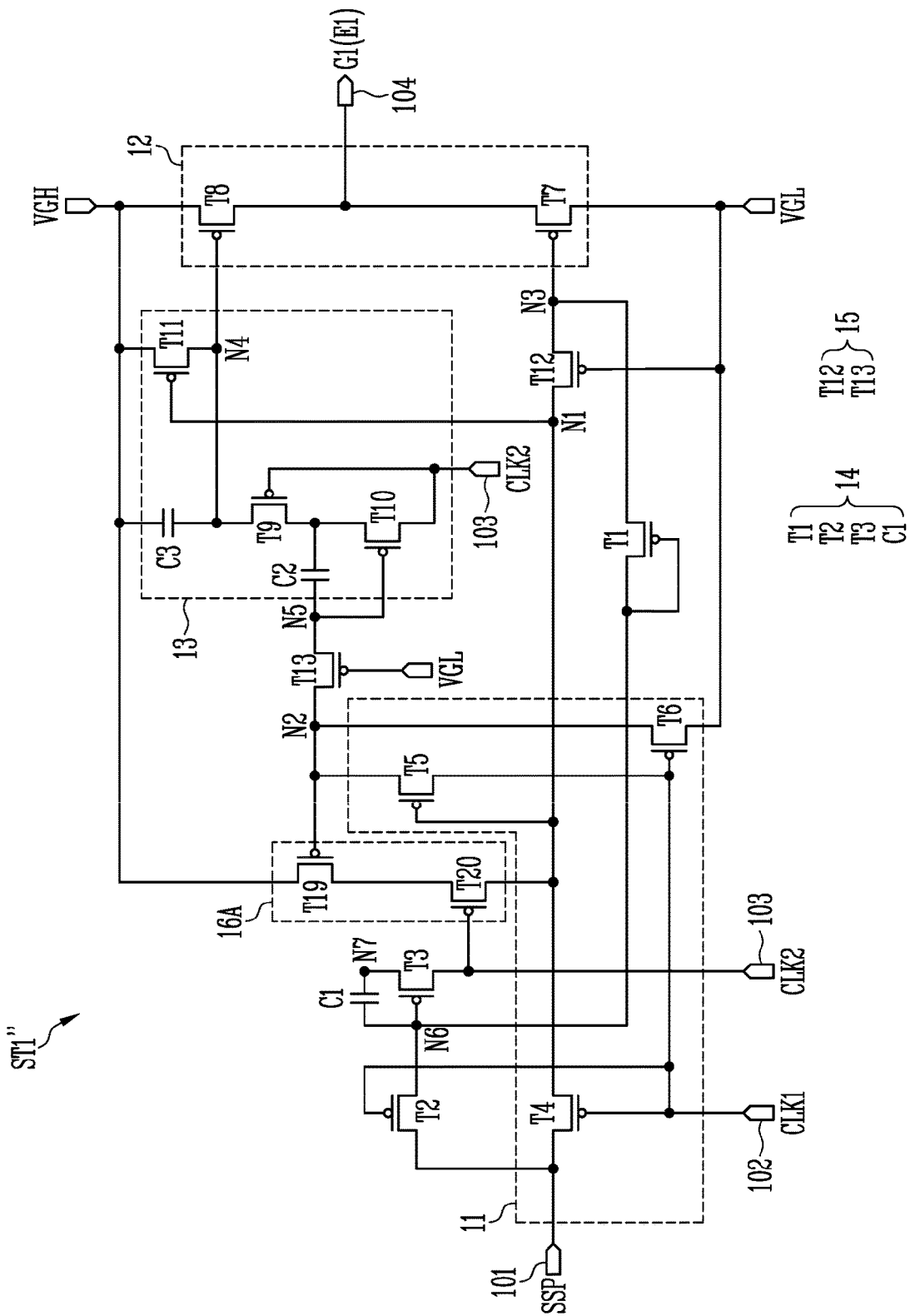
FIG. 15A to FIG. 15C illustrate circuit diagrams of examples of a stage included in the gate driver of FIG. 4.
Figure 15B:
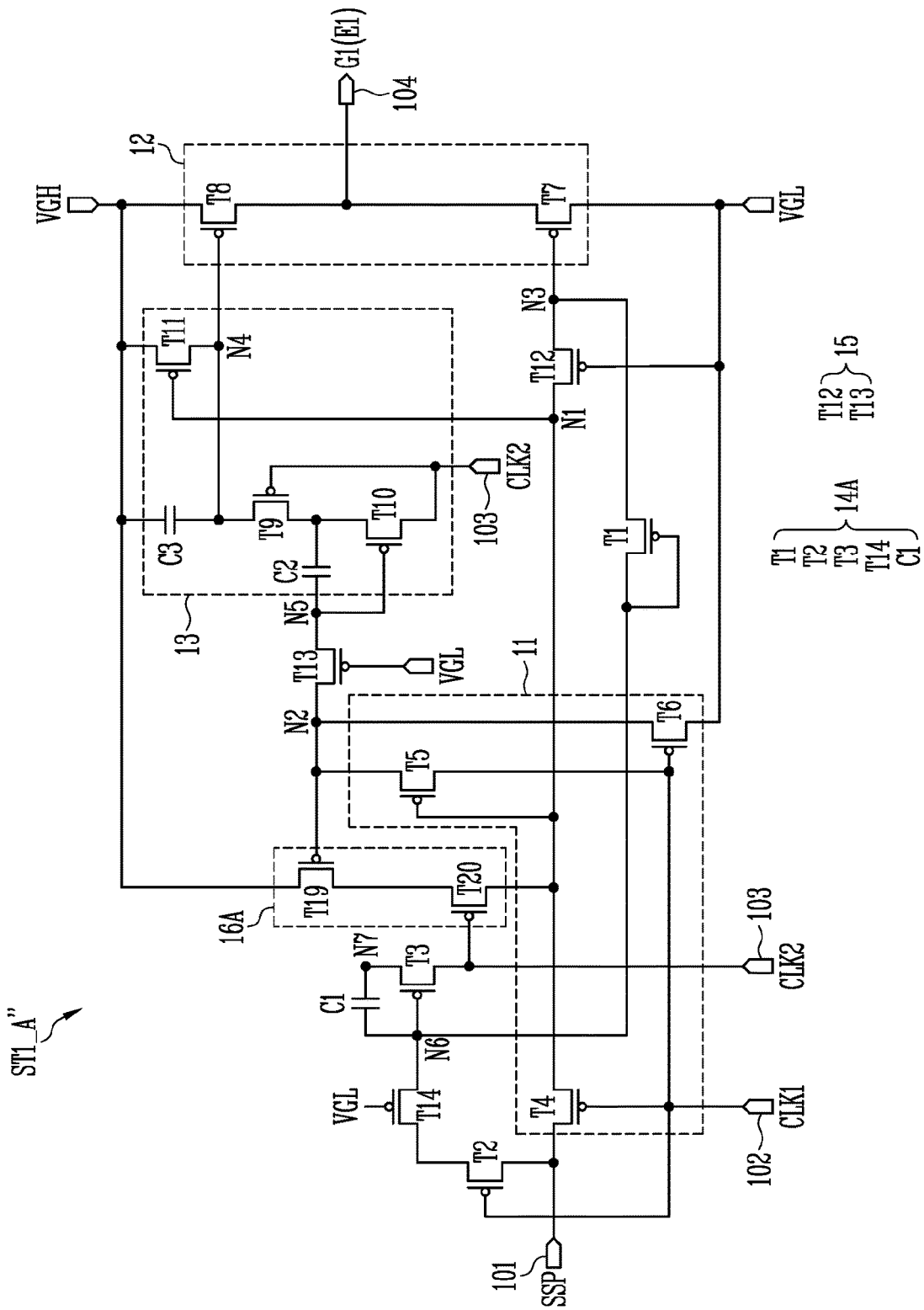
Figure 15C:
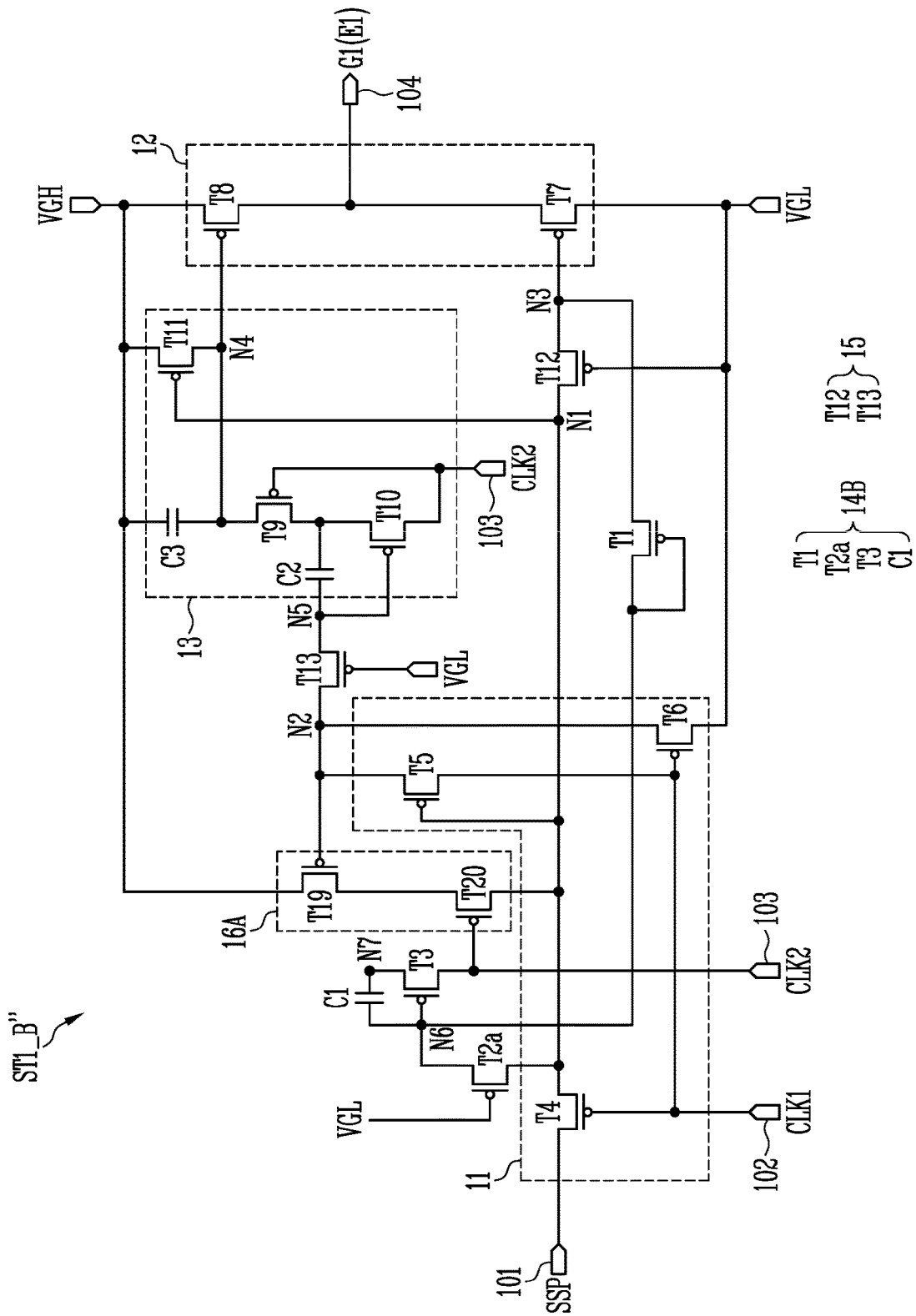

FIG. 15A to FIG. 15C illustrate circuit diagrams of examples of a stage included in the gate driver of FIG. 4.

In FIG. 15A to FIG. 15C, the same reference numerals are used for the constituent elements described with reference to FIG. 6, FIG. 8, FIG. 9, and FIG. 13A, and redundant descriptions of these constituent elements will be omitted. In addition, respective stages ST1", ST1_A", and ST1_B" of FIG. 15A to FIG. 15C may have substantially the same configuration as, or similar configuration to, the stages ST1', ST1_A', and ST1_B' of FIG. 13A, FIG. 14A, and FIG. 14B, respectively, except for dispositions of the nineteenth transistor T19 and the twentieth transistor T20.

Referring to FIG. 15A to FIG. 15C, each of the stages ST1", ST1_A", and ST1_B" may include the input part 11, the output part 12, the first signal processing part 13, second signal processing parts 14, 14A, or 14B, the stabilizing part 15, and an initializing part 16A.

The initializing part 16A may include the nineteenth transistor T19 and the twentieth transistor T20 connected in series between the second power source VGH and the first node N1.

In some embodiments, the nineteenth transistor T19 may be connected between the second power source VGH and one electrode of the twentieth transistor T20. The gate electrode of the nineteenth transistor T19 may be connected to the second node N2.

The twentieth transistor T20 may be connected between the first node N1 and one electrode of the nineteenth transistor T19. The gate electrode of the twentieth transistor T20 may be connected to the third input terminal 103.

In some embodiments of the present disclosure, the initializing part 16a directly transmits the voltage of the second power source VGH to the first node N1 during the initializing period, so that the high level voltage may be substantially immediately supplied to the first node N1 and the third node N3. Accordingly, flashing due to unintentional light emission of the pixels PX may be reduced or prevented.

Figure 16:
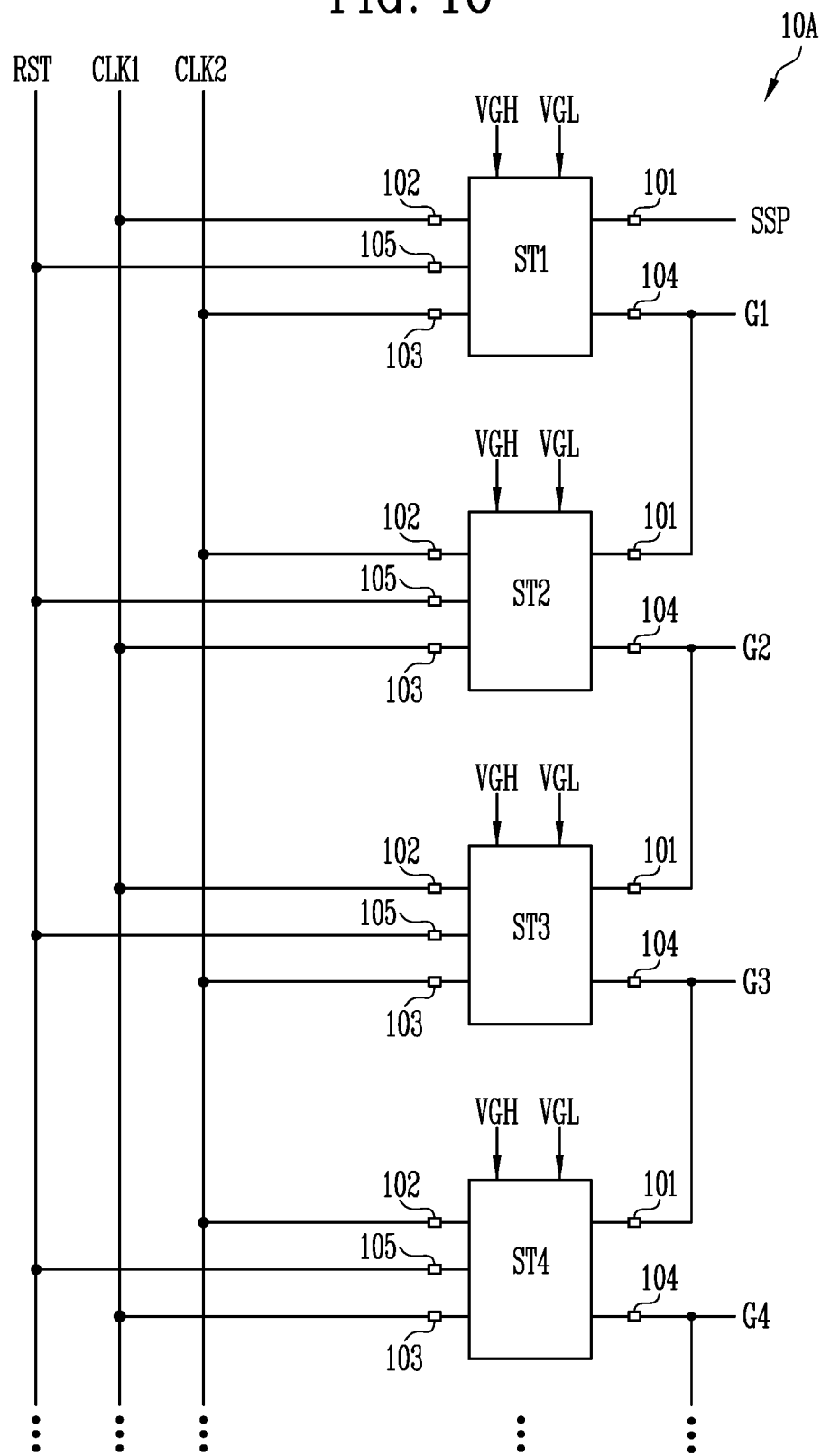
FIG. 16 illustrates a block diagram of an example of the gate driver of FIG. 4.

FIG. 16 illustrates a block diagram of an example of the gate driver of FIG. 4.

In FIG. 16, the same reference numerals are used for the constituent elements described with reference to FIG. 4, and redundant descriptions of these constituent elements will be omitted. In addition, a gate driver 10A of FIG. 16 may have substantially the same configuration as, or similar configuration to, the gate driver 10 of FIG. 4 except for a configuration of a fourth input terminal 105 that receives a reset signal RST.

Referring to FIG. 16, the gate driver 10A may include a plurality of stages ST1 to ST4.

Each of the stages ST1 to ST4 may include the first input terminal 101, the second input terminal 102, the third input terminal 103, the fourth input terminal 105, and the output terminal 104.

The fourth input terminal 105 may receive the reset signal RST. In some embodiments, the reset signal RST is a global signal, and the reset signal RST may be commonly applied to the fourth input terminals 105 of the stages ST1 to ST4.

During the initializing period in which the reset signal RST is supplied to the gate driver 10A, the high level gate signal may be simultaneously output to the gate lines G1 to G4.

Figure 17A:
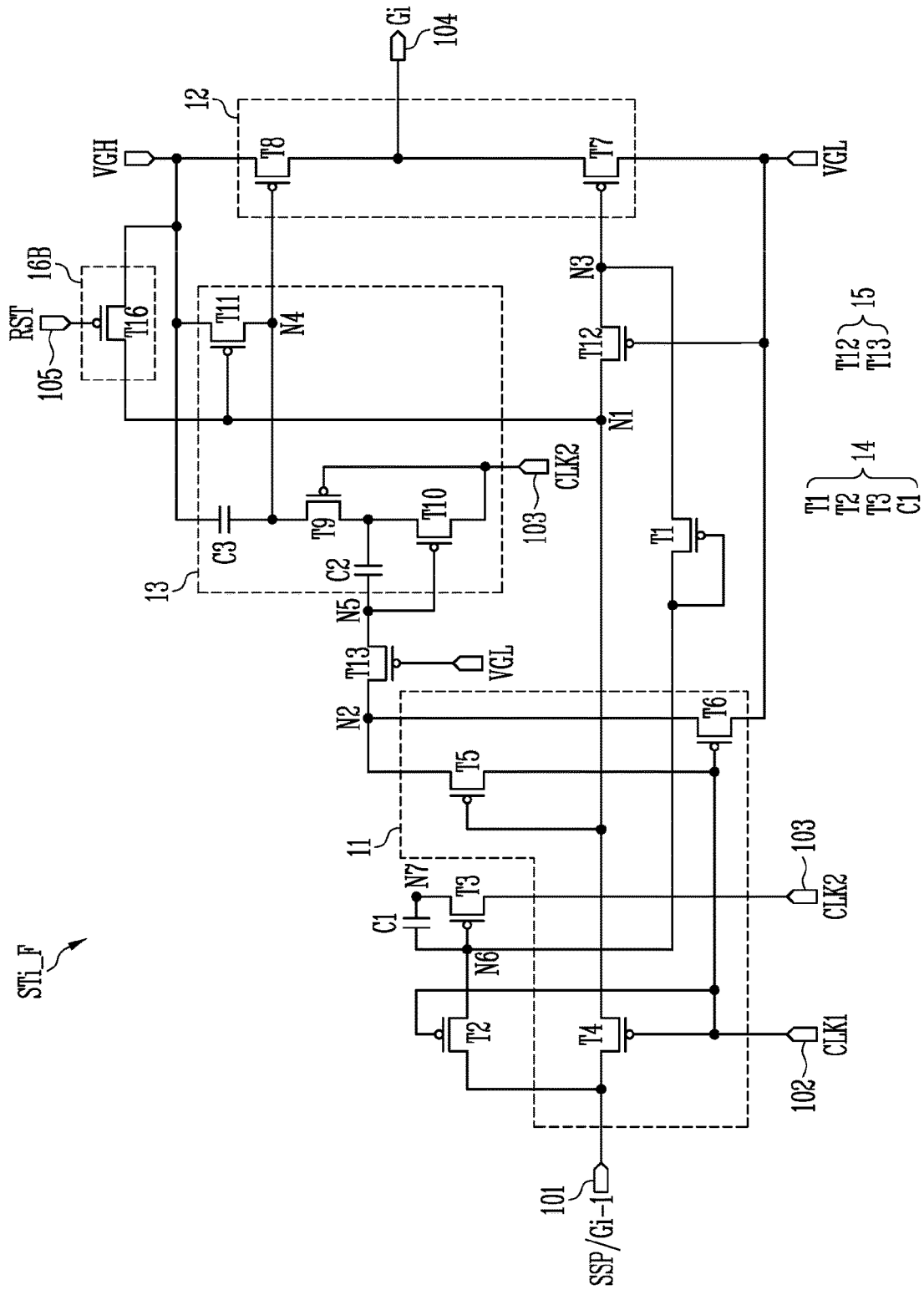
FIG. 17A to FIG. 17C illustrate circuit diagrams of examples of a stage included in the gate driver of FIG. 16.
Figure 17B:
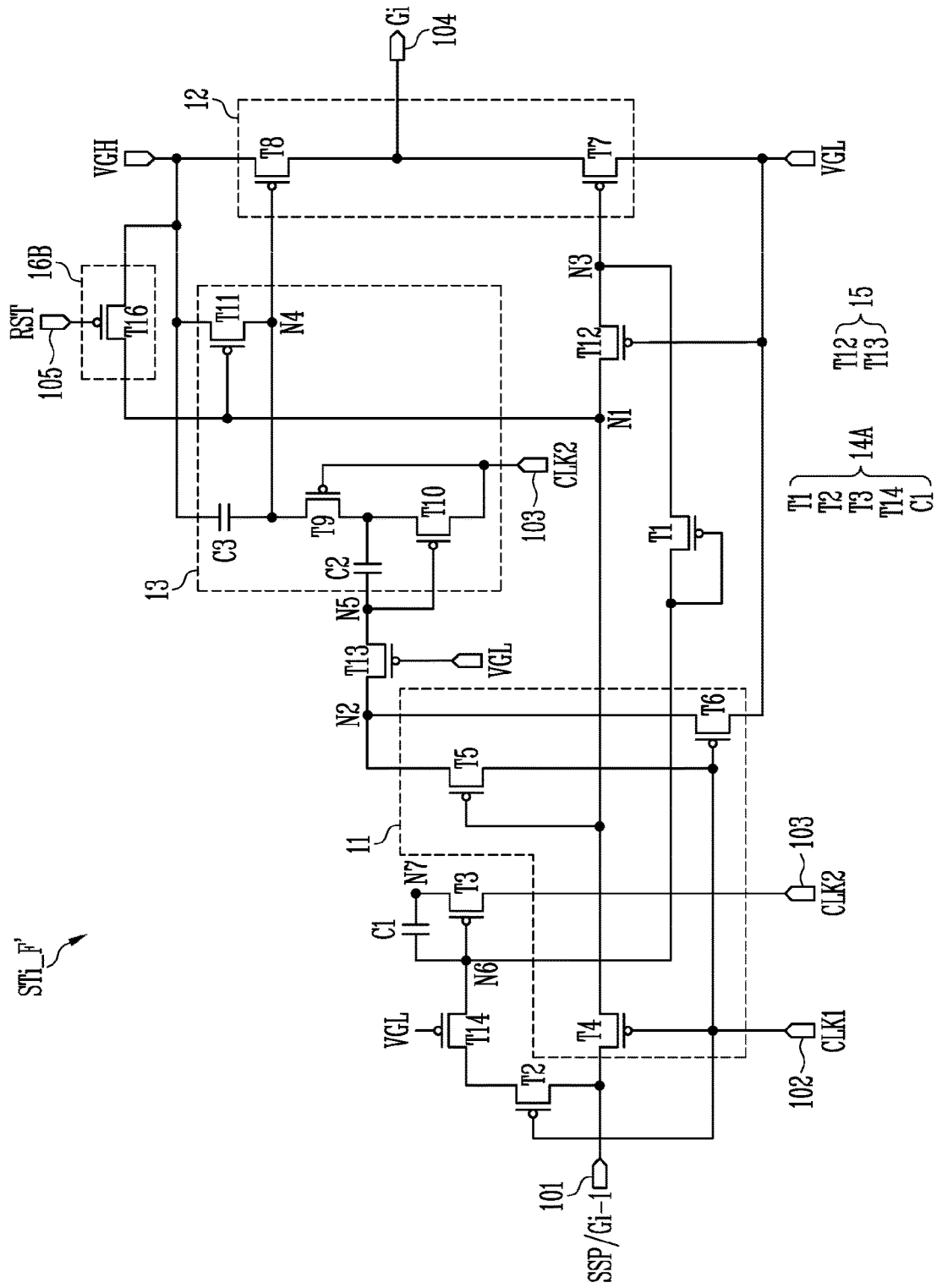
Figure 17C:
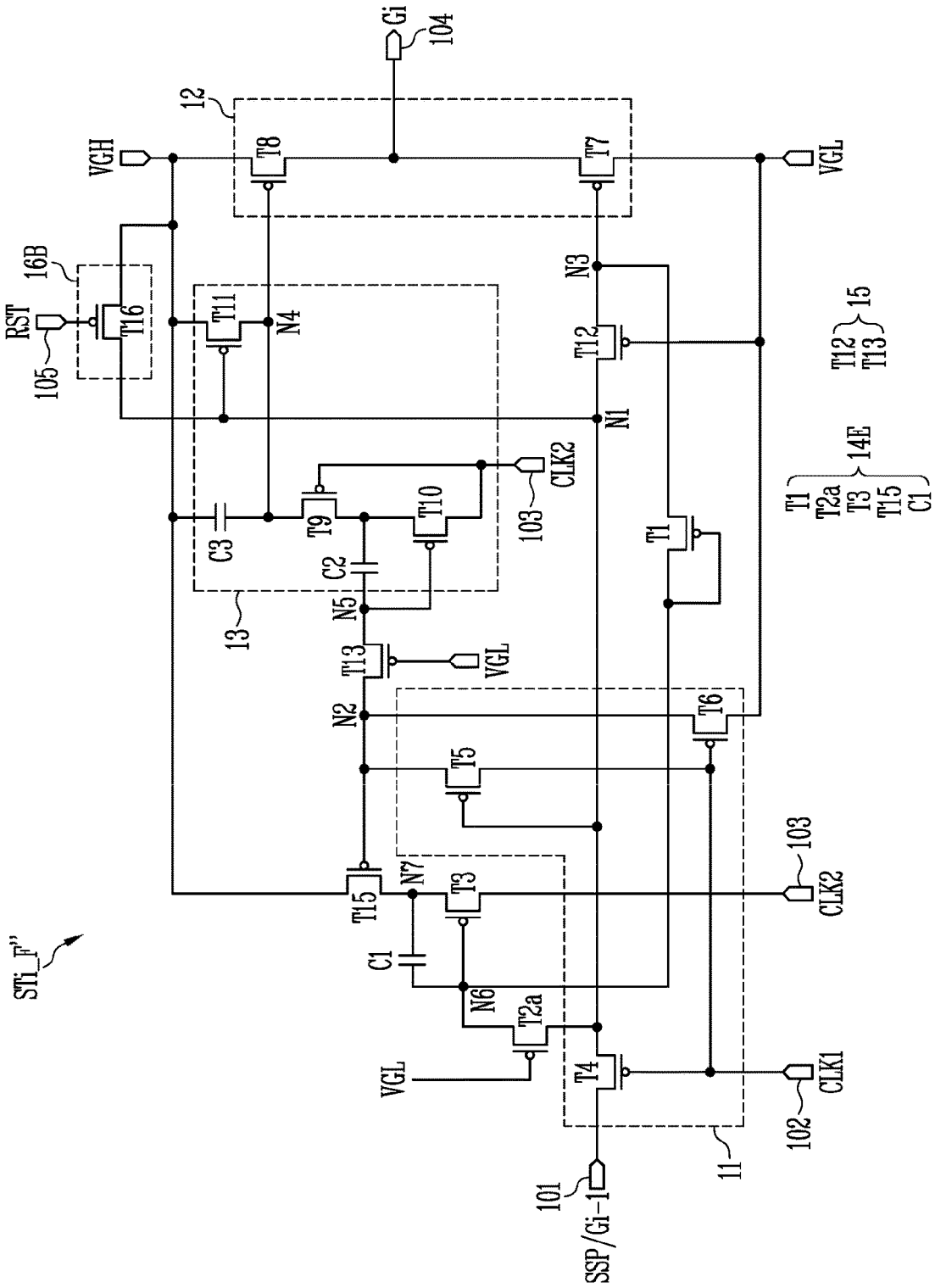
Figure 18:
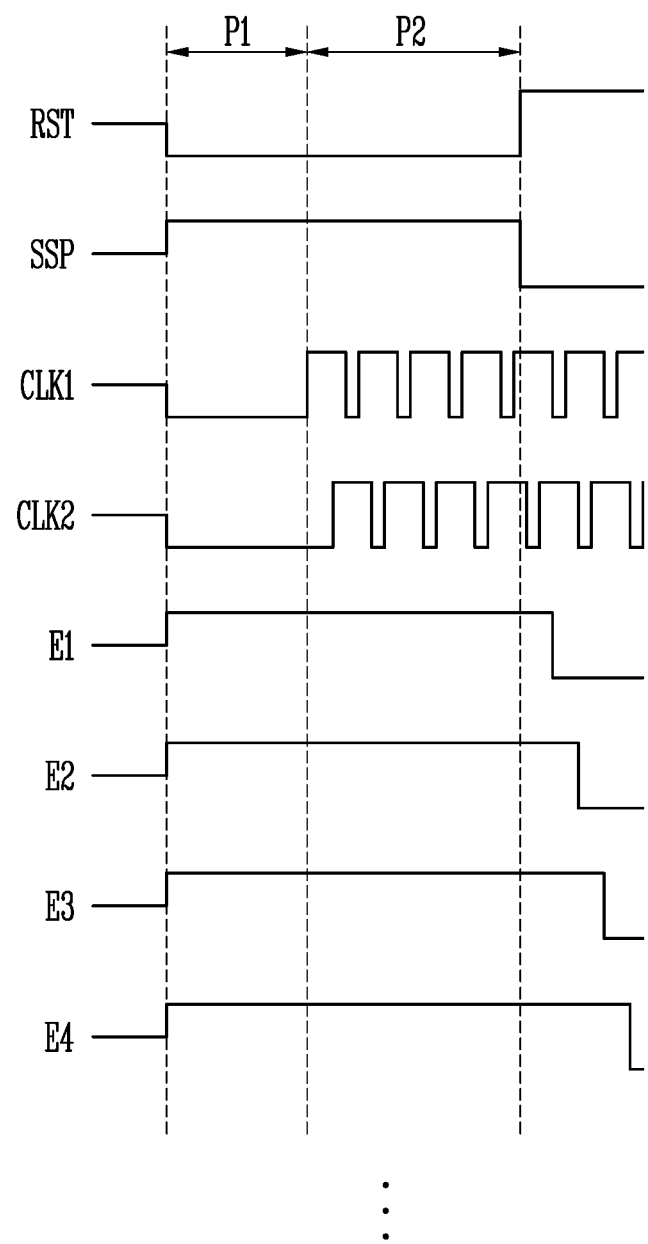
FIG. 18 illustrates a timing diagram of an example of an operation of the gate driver of FIG. 16.

FIG. 17A to FIG. 17C illustrate circuit diagrams of examples of a stage included in the gate driver of FIG. 16, and FIG. 18 illustrates a timing diagram of an example of an operation of the gate driver of FIG. 16.

In FIG. 17A to FIG. 17C, the same reference numerals are used for the constituent elements described with reference to FIG. 6, FIG. 8, and FIG. 12, and redundant descriptions of these constituent elements will be omitted. In addition, stages STi_F, STi_F', ST F" of FIG. 17A, FIG. 17B, and FIG. 17C may have substantially the same configuration as, or similar configuration to, the stage STi of FIG. 6, the stage STi_A of FIG. 8, and the stage ST_E of FIG. 12, respectively, except for a configuration of a sixteenth transistor T16.

Referring to FIG. 16, FIG. 17A, FIG. 17B, FIG. 17C, and FIG. 18, each of the stages STi_F, STi_F', and STi_F" may include the input part 11, the output part 12, the first signal processing part 13, and the second signal processing parts 14, 14A, or 14E, the stabilizing part 15, and an initializing part 16B.

In some embodiments, the initializing part 16B may include the sixteenth transistor T16 connected between the second power source VGH and the first node N1. A gate electrode of the sixteenth transistor T16 may be connected to the fourth input terminal 105, and may receive the reset signal RST.

In some embodiments, the reset signal RST may be supplied to the gate driver 10A during the initializing period P1. In addition, during the initializing period P1, the high level start pulse SSP may be supplied, and the low level first and second clock signals CLK1 and CLK2 may be supplied.

In some embodiments, the low level of the reset signal RST and the high level of the start pulse SSP may be maintained until the maintaining period P2. However, this is merely an example, and the maintaining period P2 may be omitted.

Meanwhile, during the initializing period P1, the sixteenth transistor T16 may be turned on by the reset signal RST, and the voltage of the second power source VGH may be supplied to the first node N1. Therefore, the voltages of the first node N1 and the third node N3 may stably maintain the voltage level of the second power source VGH, and the seventh transistor T7 may be completely turned off.

The ninth transistor T9 may be turned on by the second clock signal CLK2. The voltage of the fourth node N4 may have the low level due to the turned-on ninth and tenth transistors T9 and T10. Therefore, the eighth transistor T8 may be turned on, and the voltage of the second power source VGH may be output to the output terminal 104.

Accordingly, the high level emission control signal may be concurrently or substantially simultaneously output to the emission control lines E1 to E4 during the initializing period P1.

Meanwhile, the initializing part 16B may be included in at least one of the stages STi_A, STi_B, STi_C, STi_D, and STi_E of FIG. 8 to FIG. 12.

For example, FIG. 17B shows an example in which the initializing part 16B is applied to the stage STi_A in FIG. 8, and FIG. 17C shows an example in which the initializing part 16B is applied to the stage STi_E in FIG. 12. Because the operation of the initializing part 16B of FIG. 17B and FIG. 17C has been described in detail with reference to FIG. 17A, a redundant description thereof will be omitted.

Figure 19:
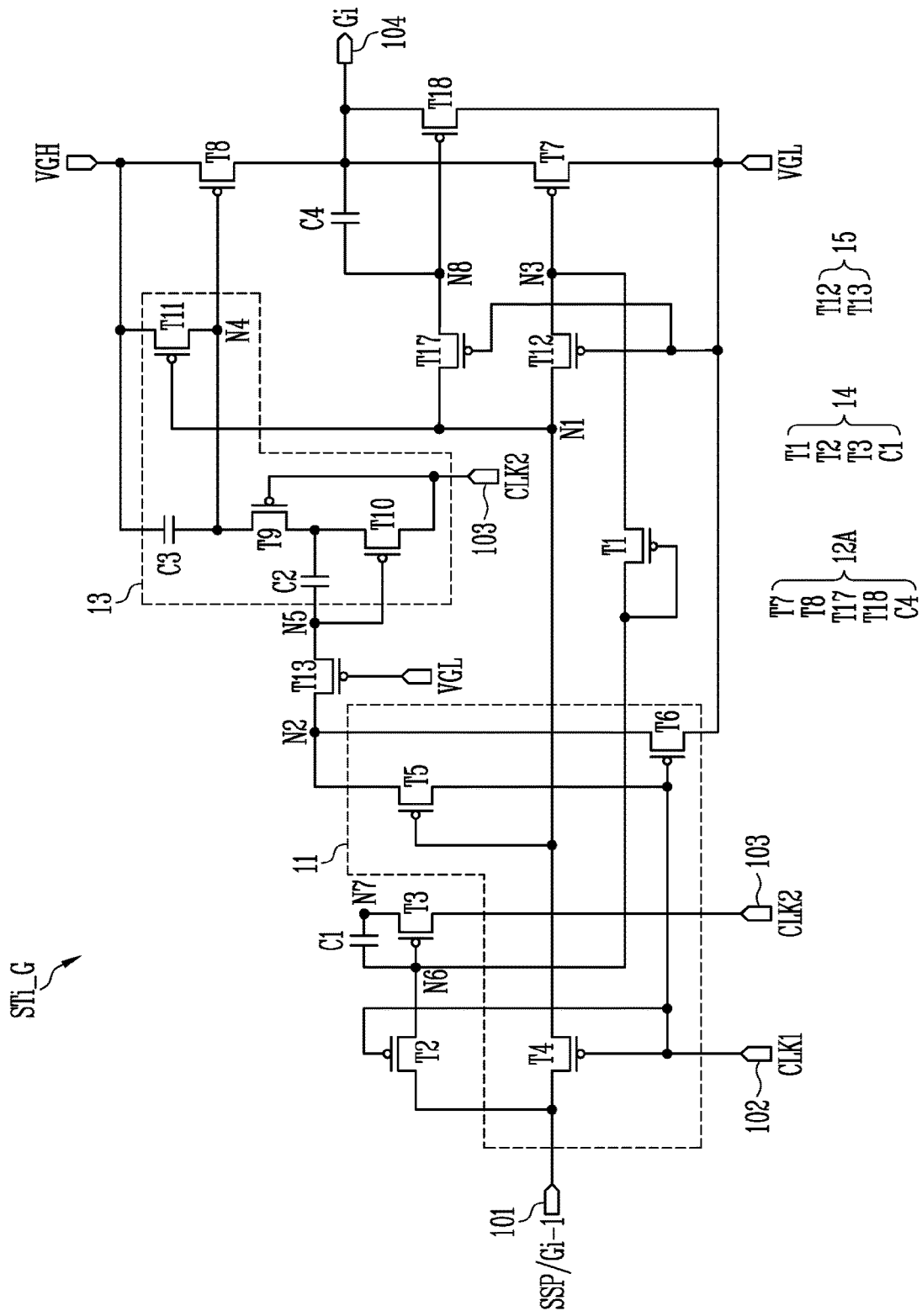
FIG. 19 illustrates a circuit diagram of another example of a stage included in the gate driver of FIG. 4.

FIG. 19 illustrates a circuit diagram of another example of a stage included in the gate driver of FIG. 4.

In FIG. 19, the same reference numerals are used for the constituent elements described with reference to FIG. 6, and redundant descriptions of these constituent elements will be omitted. In addition, a stage STi_G of FIG. 19 may have substantially the same configuration as, or similar configuration to, the stage STi of FIG. 6 except for a configuration of an output part 12A.

Referring to FIG. 19, the stage STi_G may include the input part 11, the output part 12A, the first signal processing part 13, the second signal processing part 14, and the stabilizing part 15.

In some embodiments, the output part 12A may include the seventh transistor T7, the eighth transistor T8, a seventeenth transistor T17, an eighteenth transistor T18, and a fourth capacitor C4.

The seventeenth transistor T17 may be connected between the first node N1 and an eighth node N8. A gate electrode of the seventeenth transistor T17 may be connected to the first power source VGL. Therefore, the seventeenth transistor T17 has a turn-on state, and may transmit the voltage of the first node N1 to the eighth node N8.

The eighteenth transistor T18 may be connected between the first power source VGL and the output terminal 104. A gate electrode of the eighteenth transistor T18 may be connected to the eighth node N8. The eighteenth transistor T18 may be turned on or off in response to the voltage of the eighth node N8.

The fourth capacitor C4 may be connected between the eighth node N8 and the output terminal 104. The fourth capacitor C4 may be coupled according to the voltage change of the output terminal 104 to change the voltage level of the eighth node N8. For example, the voltage of the eighth node N8 may quickly decrease to the 2-low level by coupling of the fourth capacitor C4. Accordingly, the eighteenth transistor T18 is completely turned on, thus a falling rate of the gate signal may increase, and a falling time may be reduced or minimized. Therefore, a falling step of the gate signal output may be eliminated, reduced, or minimized (for example, referred to as 1-step, or single-step, falling).

Figure 20:
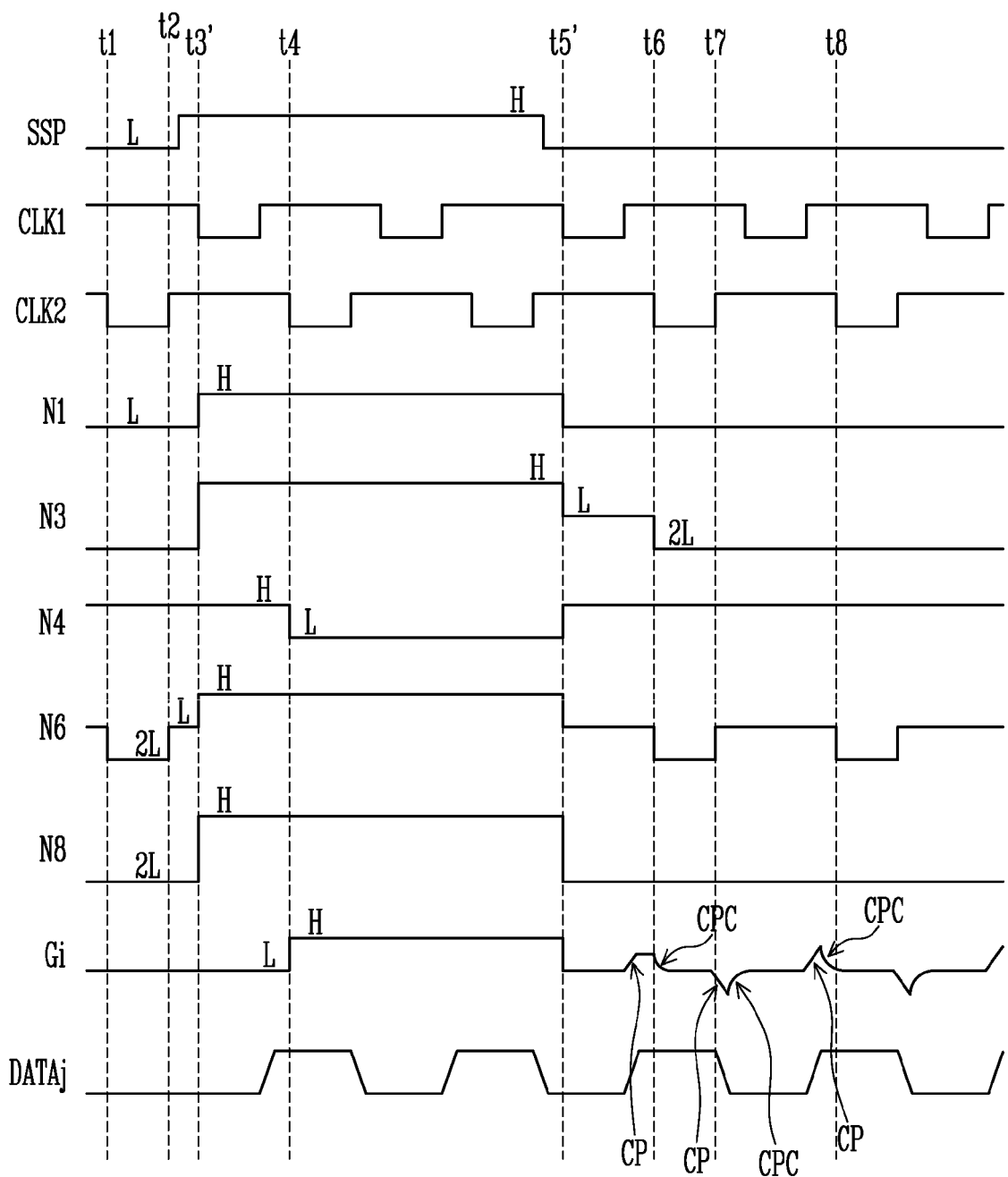
FIG. 20 illustrates a timing diagram of an example of an operation of the stage of FIG. 19.

FIG. 20 illustrates a timing diagram of an example of an operation of the stage of FIG. 19.

In FIG. 20, the same reference numerals are used for the constituent elements described with reference to FIG. 7, and redundant descriptions of these constituent elements will be omitted. In addition, an operation of the stage of FIG. 20 may be substantially the same as or similar to the operation of FIG. 7 except for an operation at a third time point t3' and at a fifth time point t5'.

Referring to FIG. 19 and FIG. 20, after the start pulse SSP transitions from the high level H to the low level L, at the fifth time point t5' at which the first clock signal CLK1 is supplied, the voltage of the eighth node N8 may decrease to the 2-low level 2L, and the gate signal output to the gate line Gi may quickly decrease to the low level L.

Hereinafter, the timing diagram of FIG. 20 will be described mainly focusing on the operation of the output part 12A.

At the first time point t1 and the second time point t2, the third node N3 and the eighth node N8 may have the voltage of the 2-low level 2L.

The first clock signal CLK1 may be supplied to the second input terminal 102 at the third time point t3'. The second transistor T2, the fourth transistor T4, and the sixth transistor T6 may be turned on in response to the first clock signal CLK1.

When the fourth transistor T4 is turned on, the voltage of the first node N1 and the voltage of the third node N3 may be changed to the high level H. Accordingly, the voltage of the high level H may be transmitted to the eighth node N8 through the turned on seventeenth transistor T17. Therefore, the seventh transistor T7 may be turned off based on the voltage of the third node N3, and the eighteenth transistor T18 may be turned off based on the voltage of the eighth node N8.

Thereafter, the operation up to the fifth time point t5' may be substantially the same as the operation described in FIG. 7.

The first clock signal CLK1 may be supplied at the fifth time point t5'. The second transistor T2, the fourth transistor T4, and the sixth transistor T6 may be turned on in response to the first clock signal CLK1.

When the fourth transistor T4 is turned on, the low level L of the start pulse SSP (or the gate signal of the previous stage) may be supplied to the first node N1. The voltage of the third node N3 may be changed to the low level L through the turned on twelfth transistor T12, and the voltage of the eighth node N8 may be changed to the low level L through the turned on seventeenth transistor T17.

In addition, the seventh and eighteenth transistors T7 and T18 may be turned on so that the voltage of the output terminal 104 may decrease. Accordingly, the voltage of the output terminal 104 and the voltage of the eighth node N8 may be coupled by the fourth capacitor C4.

Therefore, at the fifth time point t5', the voltage of the eighth node N8 is rapidly decreased to the 2-low level 2L, and the eighteenth transistor T18 is completely turned on, so that the falling rate of the gate signal may be increased. For example, as shown in FIG. 20, the gate signal output to the gate line Gi may quickly transition from the high level H to the low level L at the fifth time point t5'. That is, the falling step of the gate signal output may be eliminated. Therefore, driving reliability and image quality in a high-speed driving method may be improved.

Hereinafter, because the operation at the sixth to eighth time points t6 to t8 has been described with reference to FIG. 7, a redundant description will be omitted.

Figure 21:
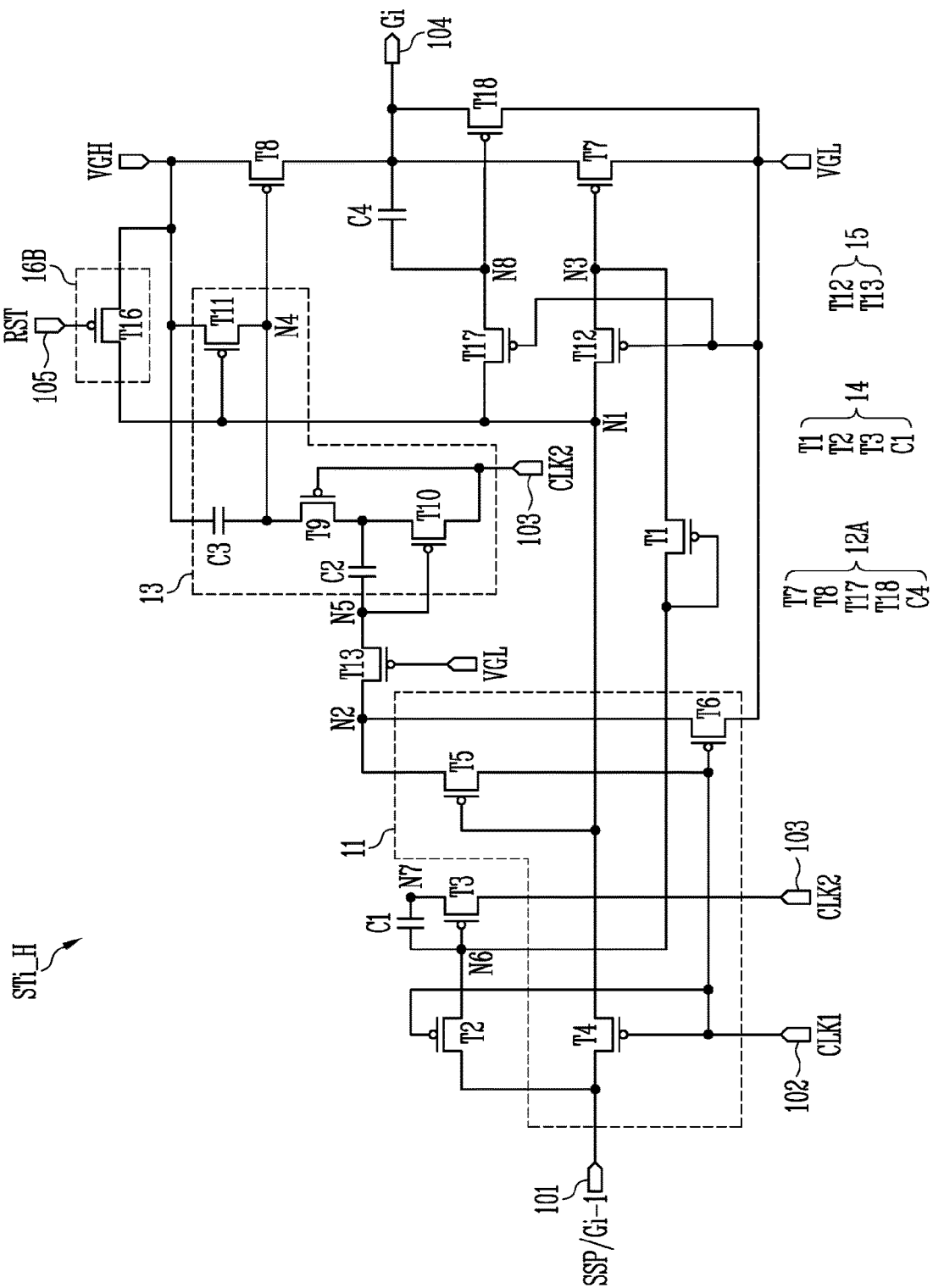
FIG. 21 illustrates a circuit diagram of another example of a stage included in the gate driver of FIG. 16.

FIG. 21 illustrates a circuit diagram of another example of a stage included in the gate driver of FIG. 16.

In FIG. 21, the same reference numerals are used for the constituent elements described with reference to FIG. 6, FIG. 17A, and FIG. 19, and redundant descriptions of these constituent elements will be omitted. In addition, a stage STi_H of FIG. 21 may have substantially the same configuration as, or similar configuration to, the stage STi_G of FIG. 19 except for a configuration of an initializing part 16B.

Referring to FIG. 21, the stage STi_H may include the input part 11, the output part 12A, the first signal processing part 13, the second signal processing part 14, the stabilizing part 15, and the initializing part 16B.

Because the configuration and operation of the input part 11, the output part 12A, the first signal processing part 13, the second signal processing part 14, the stabilizing part 15, and the initializing part 16B have been described above in detail, a redundant description will be omitted.

Meanwhile, the initializing part 16B may be included in at least one of stages STi_I, STi_J, STi_K, STi_L, and STi_M of FIG. 22 to FIG. 26 to be described later. In addition, the initializing part 16B of the stage STi_H may be replaced by the initializing part 16 of FIG. 13A or the initializing part 16A of FIG. 15A.

Figure 22:
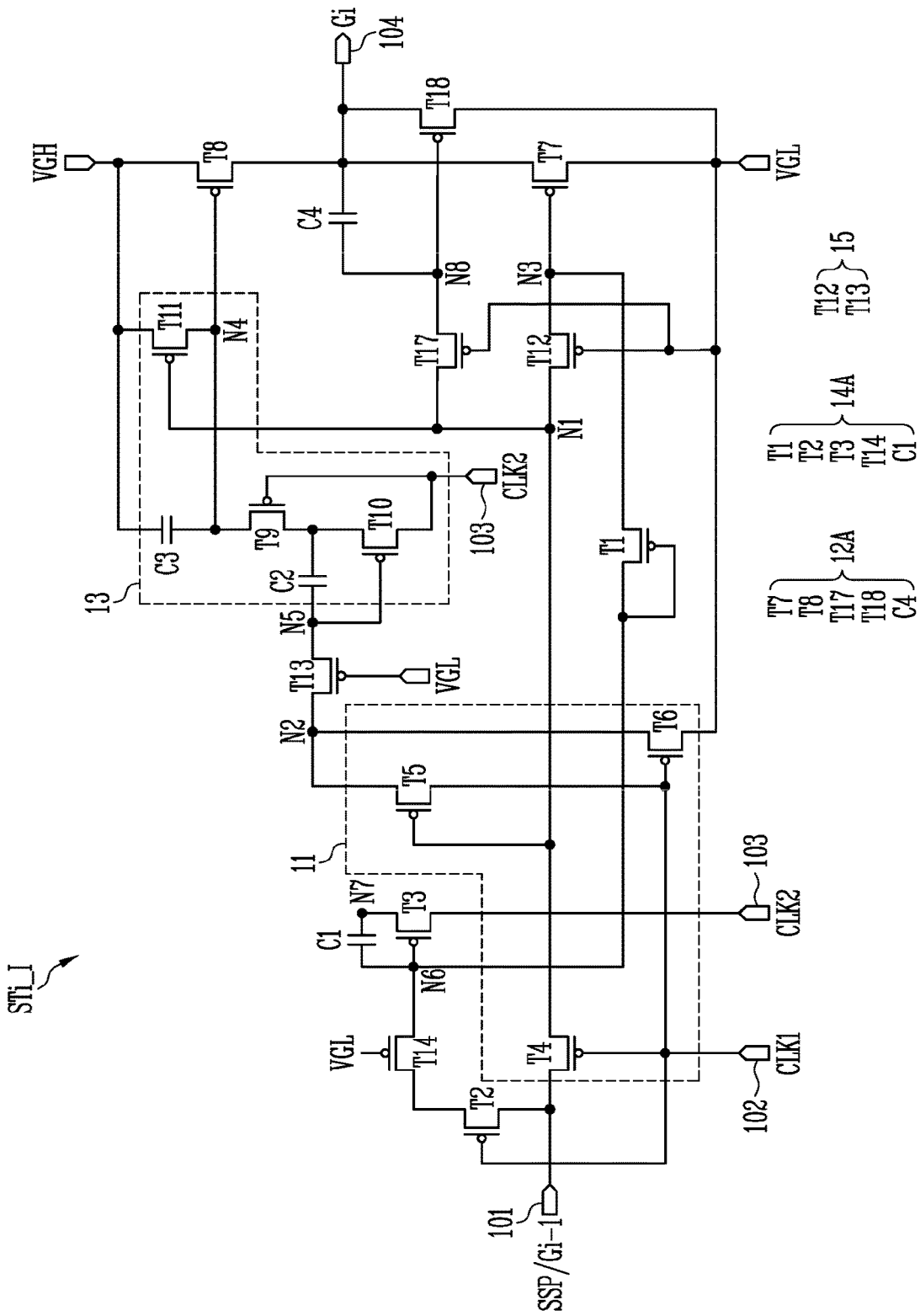
FIG. 22 illustrates a circuit diagram of another example of a stage included in the gate driver of FIG. 4.
Figure 23:
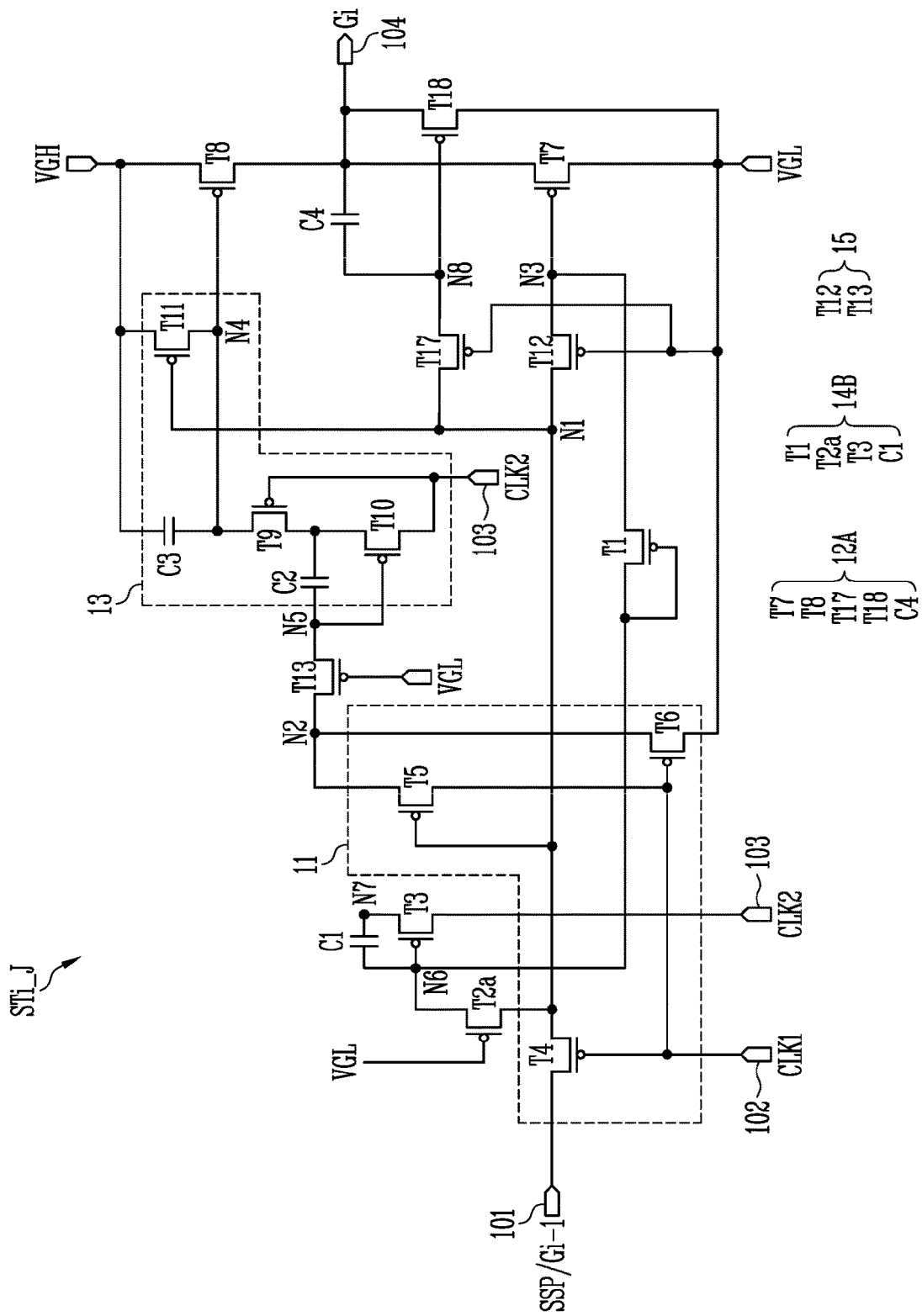
FIG. 23 illustrates a circuit diagram of another example of a stage included in the gate driver of FIG. 4.
Figure 24:
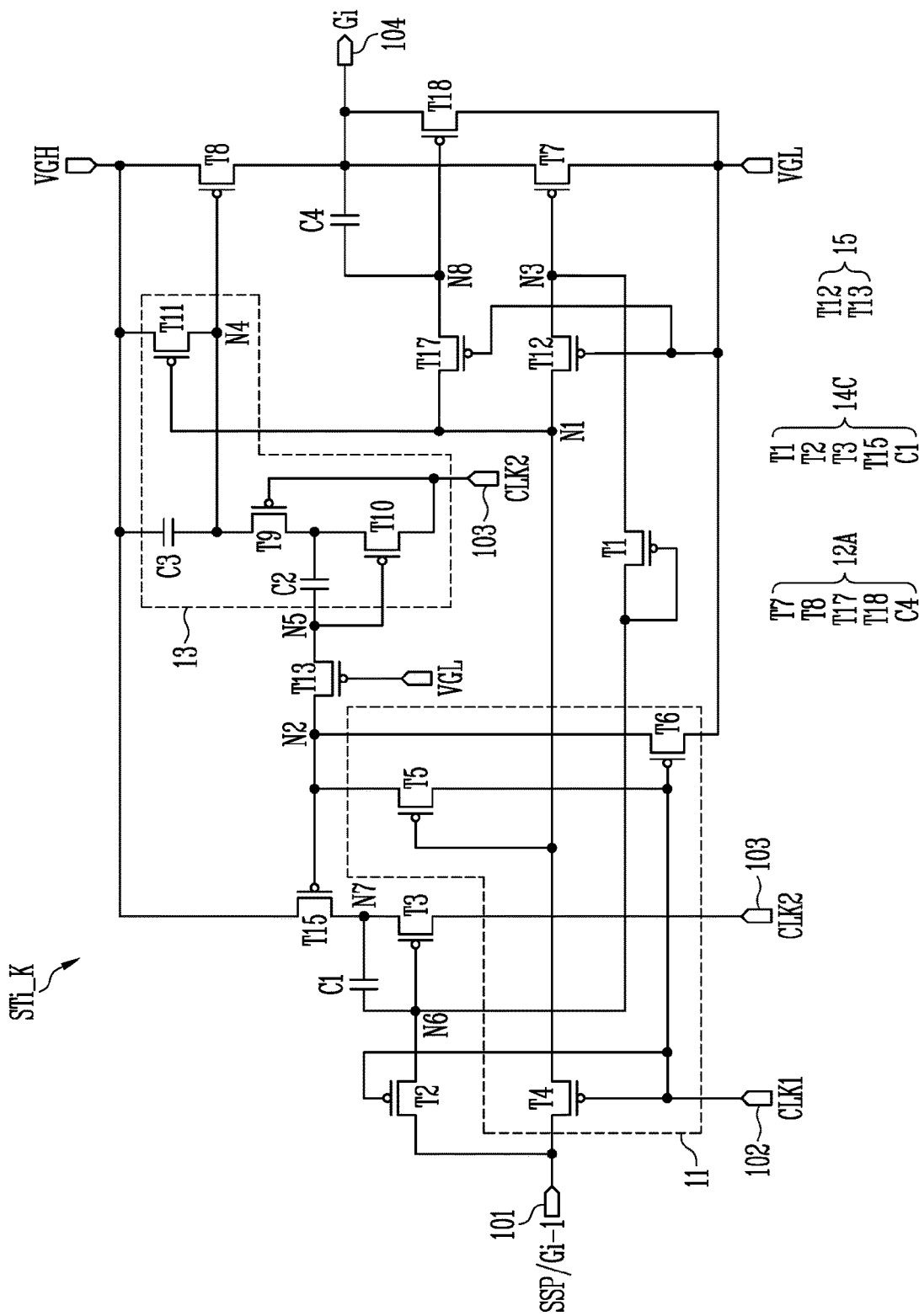
FIG. 24 illustrates a circuit diagram of another example of a stage included in the gate driver of FIG. 4.
Figure 25:
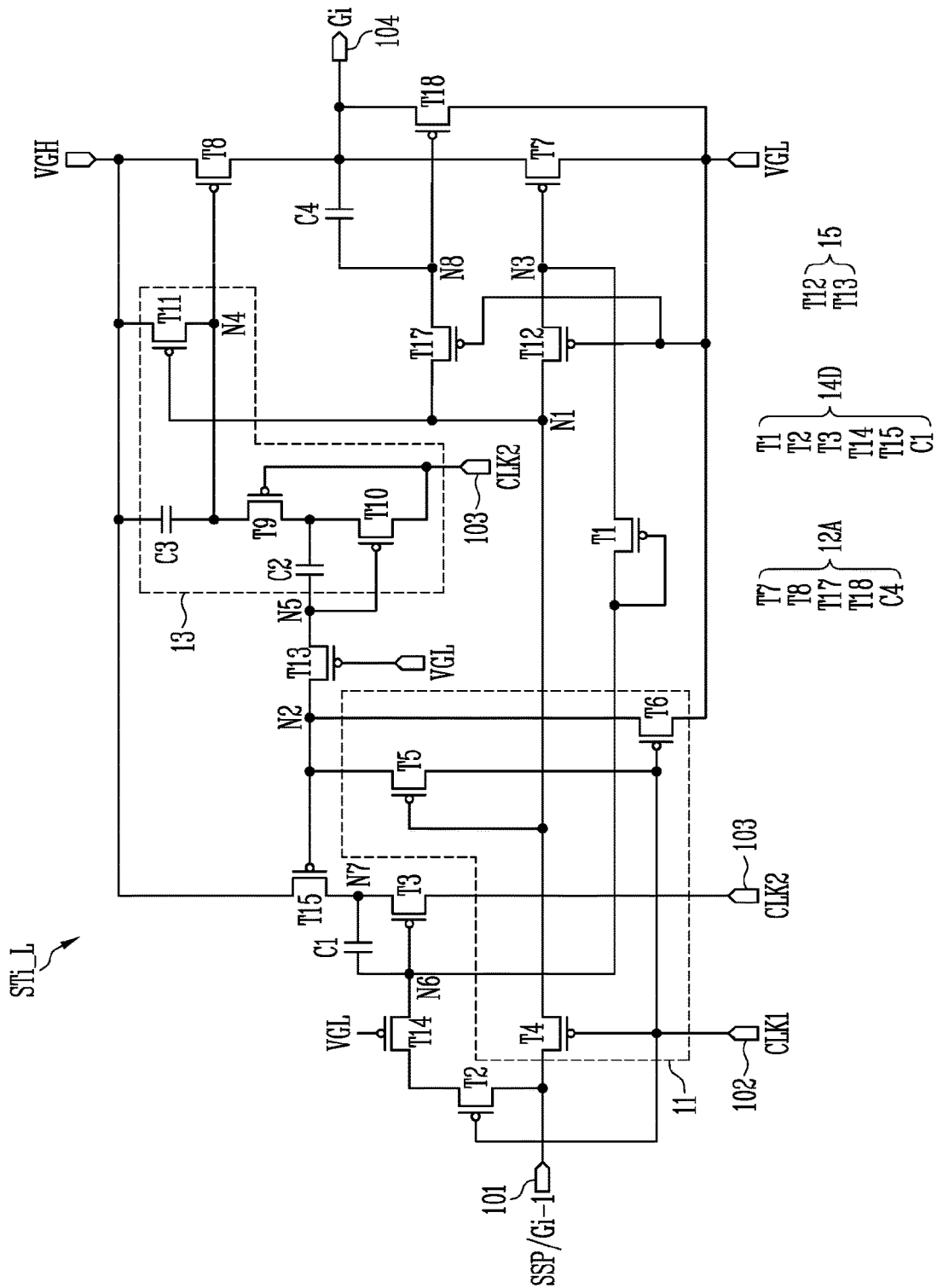
FIG. 25 illustrates a circuit diagram of another example of a stage included in the gate driver of FIG. 4.
Figure 26:
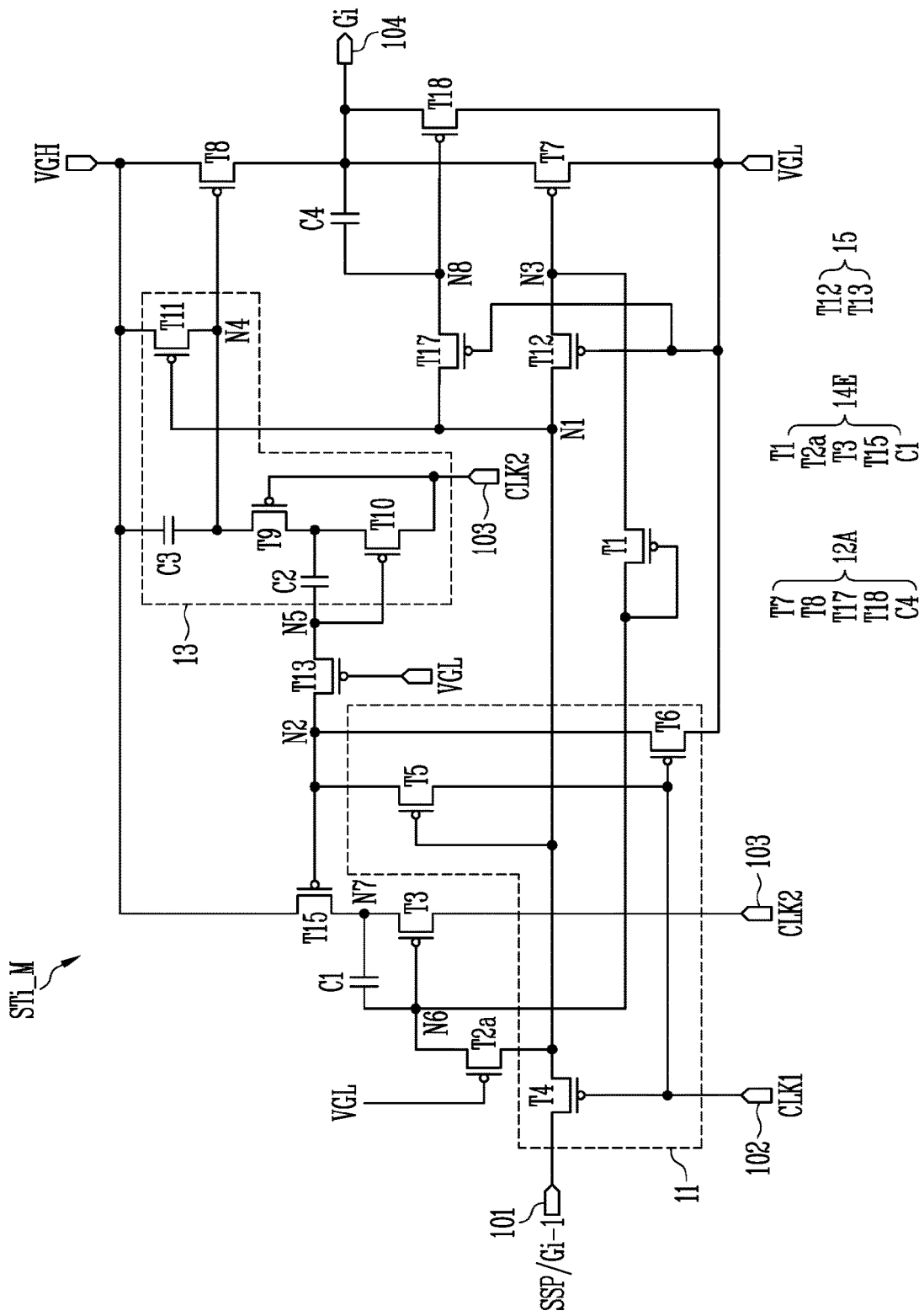
FIG. 26 illustrates a circuit diagram of another example of a stage included in the gate driver of FIG. 4.

FIG. 22 illustrates a circuit diagram of another example of a stage included in the gate driver of FIG. 4, FIG. 23 illustrates a circuit diagram of another example of a stage included in the gate driver of FIG. 4, FIG. 24 illustrates a circuit diagram of another example of a stage included in the gate driver of FIG. 4, FIG. 25 illustrates a circuit diagram of another example of a stage included in the gate driver of FIG. 4, and FIG. 26 illustrates a circuit diagram of another example of a stage included in the gate driver of FIG. 4.

In FIG. 21 to FIG. 26, the same reference numerals are used for the constituent elements described with reference to FIGS. 6, 8, 9, 10, 11, 12, and 19, and redundant descriptions of these constituent elements will be omitted.

Referring to FIG. 22 to FIG. 26, stages STi_I, STi_J, STi_K, STi_L, and STi_M may include the input part 11, the output part 12A, the first signal processing part 13, the second signal processing parts 14A, 14B, 14C, 14D, or 14E, and the stabilizing part 15.

In some embodiments, the stages STi_I, STi_J, STi_K, STi_L, and STi_M may include the output part 12A described with reference to FIG. 19. Therefore, the falling step of the gate signal may be eliminated, reduced, or minimized.

As shown in FIG. 22, the stage STi_I may include the second signal processing part 14A described with reference to FIG. 8.

As shown in FIG. 23, the stage STi_J may include the second signal processing part 14B described with reference to FIG. 9.

As shown in FIG. 24, the stage STi_K may include the second signal processing part 14C described with reference to FIG. 10.

As shown in FIG. 25, the stage STi_L may include the second signal processing part 14D described with reference to FIG. 11.

As shown in FIG. 26, the stage STi_M may include the second signal processing part 14E described with reference to FIG. 12.

As described above, the stage of the gate driver (e.g., gate driver 10 of FIG. 4 or gate driver 10A of FIG. 13) according to some embodiments of the present disclosure may stably maintain the voltage of the third node N3 at the 2-low level 2L through operation, such as operation of the charge pump of the second signal processing parts 14, 14A, 14B, 14C, 14D, or 14E including the diode-connected first transistor T1. The coupling error (see CP in FIG. 7 and FIG. 20) occurring in the low level gate signal may be immediately compensated by the voltage of the third node N3 of the 2-low level 2L supplied to the gate electrode of the seventh transistor T7 (see CPC of FIG. 7 and FIG. 20). Therefore, the low level L of the gate signal output from the gate line Gi may be maintained relatively stable.

Therefore, in the display device (e.g., the display device 1000 in FIG. 1) that includes the gate driver, the luminance deviation, such as crosstalk and flicker, due to coupling between the data line and the gate line (for example, the scan line and/or the emission control lines) may be improved.

In addition, because the stage includes the initializing part, it is possible to reduce or prevent flashing in which pixels unintentionally emit light during an initializing period or a driving initialization (for example, an initializing period) of a display device, and it is possible to stably perform start-up initialization.

While embodiments of the present disclosure have been described in connection with what is presently considered to be practical embodiments, it is to be understood that the invention is not limited to the disclosed embodiments, but, on the contrary, is intended to cover various modifications and equivalent arrangements included within the spirit and scope of the appended claims, with functional equivalents thereof to be included therein.

What is claimed is:

1. A gate driver comprising a stage configured to output a gate signal, the stage comprising:
    a first input terminal configured to receive an output signal of a previous stage or a start pulse;
    a second input terminal configured to receive a first clock signal;
    a third input terminal configured to receive a second clock signal that is shifted from the first clock signal;
    a first power source;
    a second power source;
    an input part comprising a fourth transistor and configured to control a voltage of a first node and a voltage of a second node based on signals supplied to the first input terminal and the second input terminal, wherein the fourth transistor is connected between the first input terminal and the first node and comprises a gate electrode connected to the second input terminal;
    an output part comprising a seventh transistor and an eighth transistor and configured to supply a voltage of the first power source or a voltage of the second power source as the gate signal to an output terminal based on a voltage of a third node and a voltage of a fourth node, wherein the seventh transistor is connected between the first power source and the output terminal and comprises a gate electrode connected to the third node, and wherein the eighth transistor is connected between the second power source and the output terminal and comprises a gate electrode connected to the fourth node;
    a first signal processing part comprising an eleventh transistor and configured to supply the voltage of the second power source to the fourth node based on the voltage of the first node, or to electrically connect the second node and the fourth node through a fifth node based on a signal supplied to the third input terminal, wherein the eleventh transistor is connected between the second power source and the fourth node and comprises a gate electrode connected to the first node; and
    a second signal processing part comprising a first transistor that is diode-connected between the third node and a sixth node, and that comprises a gate electrode coupled to the sixth node, to control the voltage of the third node based on an operation of the first transistor.

2. The gate driver of claim 1, wherein the second signal processing part further comprises:
    a second transistor connected between the first input terminal and the sixth node, and comprising a gate electrode connected to the second input terminal;
    a third transistor connected between the third input terminal and a seventh node, and comprising a gate electrode connected to the sixth node; and a first capacitor connected between the sixth node and the seventh node.

3. The gate driver of claim 2, wherein the second signal processing part further comprises a fourteenth transistor connected between the second transistor and the sixth node, and comprising a gate electrode configured to receive the voltage of the first power source.

4. The gate driver of claim 2, wherein the second signal processing part comprises a fifteenth transistor connected between the second power source and the seventh node, and comprising a gate electrode connected to the second node.

5. The gate driver of claim 1, wherein the second signal processing part further comprises:
a second transistor connected between the first node and the sixth node;
a third transistor connected between the third input terminal and a seventh node, and comprising a gate electrode connected to the sixth node; and
a first capacitor connected between the sixth node and the seventh node.

6. The gate driver of claim 5, wherein the second signal processing part further comprises a fifteenth transistor connected between the second power source and the seventh node, and comprising a gate electrode connected to the second node.

7. The gate driver of claim 1, wherein the stage further comprises a stabilizing part electrically connected between the input part and the output part, and configured to limit a voltage drop amount of the first node and a voltage drop amount of the second node.

8. The gate driver of claim 7, wherein the stabilizing part comprises:
a twelfth transistor connected between the first node and the third node, and comprising a gate electrode for receiving the voltage of the first power source; and
a thirteenth transistor connected between the second node and the fifth node, and comprising a gate electrode for receiving the voltage of the first power source.

9. The gate driver of claim 1, wherein the stage further comprises an initializing part configured to supply the voltage of the second power source to the first node during an initializing period.

10. The gate driver of claim 9, wherein the initializing part comprises a nineteenth transistor and a twentieth transistor connected in series between the second power source and the first node,
wherein the nineteenth transistor comprises a gate electrode connected to the second node, and
wherein the twentieth transistor comprises a gate electrode connected to the third input terminal.

11. The gate driver of claim 9, wherein the initializing part comprises a sixteenth transistor connected between the second power source and the first node, and comprising a gate electrode for receiving a reset signal.

12. The gate driver of claim 9, wherein the gate driver is configured to substantially simultaneously output the gate signal having a high level to all of gate lines during the initializing period.

13. The gate driver of claim 1, wherein the input part further comprises;
a fifth transistor connected between the second input terminal and the second node, and comprising a gate electrode connected to the first node; and
a sixth transistor connected between the first power source and the second node, and comprising a gate electrode connected to the second input terminal.

14. The gate driver of claim 1, wherein the first transistor is configured to convert a voltage of the sixth node having a form similar to an AC voltage into a form of a DC voltage as the voltage of the third node.

15. The gate driver of claim 1, wherein the output part further comprises:
a seventeenth transistor connected between the first node and an eighth node, and comprising a gate electrode connected to the first power source;
an eighteenth transistor connected between the first power source and the output terminal, and comprising a gate electrode connected to the eighth node; and
a fourth capacitor connected between the eighth node and the output terminal.

16. The gate driver of claim 15, wherein the output part controls a voltage drop amount of the gate signal by using coupling of the fourth capacitor according to a voltage change of the output terminal.

17. The gate driver of claim 1, wherein the first signal processing part further comprises:
a second capacitor comprising a first terminal connected to the fifth node;
a ninth transistor connected between a second terminal of the second capacitor and the fourth node, and comprising a gate electrode connected to the third input terminal;
a tenth transistor connected between the second terminal of the second capacitor and the third input terminal, and comprising a gate electrode connected to the fifth node; and
a third capacitor connected between the second power source and the fourth node.

18. A display device comprising:
pixels;
a scan driver comprising scan stages to supply a scan signal to the pixels through scan lines;
a data driver configured to supply data signals to the pixels through data lines; and
an emission driver comprising emission control stages to supply an emission control signal to the pixels through emission control lines,
wherein at least one of the scan stages or the emission control stages comprises:
a first input terminal configured to receive an output signal of a previous stage or a start pulse;
a second input terminal configured to receive a first clock signal;
a third input terminal configured to receive a second clock signal that is shifted from the first clock signal;
a first power source;
a second power source;
an input part comprising a fourth transistor and configured to control a voltage of a first node and a voltage of a second node based on signals supplied to the first input terminal and the first clock signal supplied to the second input terminal;
an output part comprising a seventh transistor and an eighth transistor and configured to supply a voltage of the first power source or a voltage of the second power source as the scan signal or the emission control signal to an output terminal based on a voltage of a third node and a voltage of a fourth node, wherein the seventh transistor is connected between the first power source and the output terminal and comprises a gate electrode connected to the third node, and wherein the eighth transistor is connected between the second power source and the output terminal and comprises a gate electrode connected to the fourth node;

a first signal processing part comprising an eleventh transistor and configured to supply the voltage of the second power source to the fourth node based on the voltage of the first node, or to electrically connect the second node and the fourth node through a fifth node based on the second clock signal supplied to the third input terminal, wherein the eleventh transistor is connected between the second power source and the fourth node and comprises a gate electrode connected to the first node; and a second signal processing part comprising a first transistor that is diode-connected between the third node and a sixth node, and that comprises a gate electrode coupled to the sixth node, to control the voltage of the third node based on an operation of the first transistor.

19. The display device of claim 18, wherein the second signal processing part further comprises:

a second transistor connected between the first input terminal and the sixth node, and comprising a gate electrode connected to the second input terminal;

a third transistor connected between the third input terminal and a seventh node and comprising a gate electrode connected to the sixth node; and a first capacitor connected between the sixth node and the seventh node.

* * * * *